(12) United States Patent
Maeda et al.

(10) Patent No.: US 9,698,268 B2
(45) Date of Patent: Jul. 4, 2017

(54) METHODS OF FORMING SEMICONDUCTOR DEVICES, INCLUDING FORMING A SEMICONDUCTOR MATERIAL ON A FIN, AND RELATED SEMICONDUCTOR DEVICES

(71) Applicant: Samsung Electronics Co., Ltd., Suwon-si, Gyeonggi-do (KR)

(72) Inventors: Shigenobu Maeda, Seongnam-si (KR); Bo-Ram Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/158,859

(22) Filed: May 19, 2016

(65) Prior Publication Data

US 2016/0268416 A1 Sep. 15, 2016

Related U.S. Application Data

(63) Continuation of application No. 14/600,219, filed on Jan. 20, 2015, now Pat. No. 9,373,706.

(60) Provisional application No. 61/931,342, filed on Jan. 24, 2014.

(30) Foreign Application Priority Data

Sep. 5, 2014 (KR) ........................ 10-2014-0119307

(51) Int. Cl.
*H01L 21/70* (2006.01)
*H01L 29/78* (2006.01)
*H01L 29/66* (2006.01)
*H01L 29/10* (2006.01)
*H01L 27/092* (2006.01)
*H01L 27/108* (2006.01)
*H01L 27/11* (2006.01)
*H01L 29/06* (2006.01)
*H01L 29/267* (2006.01)

(52) U.S. Cl.
CPC ........ *H01L 29/785* (2013.01); *H01L 27/0924* (2013.01); *H01L 27/108* (2013.01); *H01L 27/11* (2013.01); *H01L 29/0649* (2013.01); *H01L 29/1054* (2013.01); *H01L 29/267* (2013.01); *H01L 29/66795* (2013.01); *H01L 29/66818* (2013.01)

(58) Field of Classification Search
CPC ............. H01L 21/8228; H01L 21/8238; H01L 27/0826; H01L 27/092
USPC ................................ 257/368, 339; 438/299
See application file for complete search history.

(56) References Cited

U.S. PATENT DOCUMENTS

| | | |
|---|---|---|
| 7,602,006 B2 | 10/2009 | Huang et al. |
| 7,713,803 B2 | 5/2010 | Jin et al. |
| 7,829,932 B2 | 11/2010 | Song et al. |
| 7,928,426 B2 | 4/2011 | Chui et al. |
| 8,058,157 B2 | 11/2011 | Zhu et al. |
| 8,129,749 B2 | 3/2012 | Pillarisetty et al. |

(Continued)

*Primary Examiner* — Sonya D McCall Shepard
(74) *Attorney, Agent, or Firm* — Myers Bigel, P.A.

(57) ABSTRACT

Methods of forming a semiconductor device are provided. A method of forming a semiconductor device includes forming a semiconductor layer on a fin, where the fin and the semiconductor layer include first and second semiconductor materials, respectively. Moreover, the method includes defining first and second active fins that include the second semiconductor material, by removing at least a portion of the fin. Related semiconductor devices are also provided.

14 Claims, 49 Drawing Sheets

(56) References Cited

U.S. PATENT DOCUMENTS

| | | | |
|---|---|---|---|
| 8,283,653 B2 | 10/2012 | Pillarisetty et al. | |
| 8,344,425 B2 | 1/2013 | Radosavljevic et al. | |
| 8,368,052 B2 | 2/2013 | Pillarisetty et al. | |
| 8,445,963 B2 | 5/2013 | Jakschik et al. | |
| 8,497,177 B1 | 7/2013 | Chang et al. | |
| 8,551,833 B2 | 10/2013 | Chang et al. | |
| 8,553,455 B2 | 10/2013 | Tiwari et al. | |
| 8,575,596 B2 | 11/2013 | Pillarisetty et al. | |
| 8,575,653 B2 | 11/2013 | Rachmady et al. | |
| 8,592,803 B2 | 11/2013 | Pillarisetty et al. | |
| 8,796,666 B1 * | 8/2014 | Huang | H01L 29/66795 257/18 |
| 9,087,902 B2 * | 7/2015 | Lee | H01L 29/785 |
| 9,159,824 B2 * | 10/2015 | Lee | H01L 29/66431 |
| 2006/0148182 A1 | 7/2006 | Datta et al. | |
| 2011/0169101 A1 | 7/2011 | Doornbos et al. | |
| 2011/0223735 A1 | 9/2011 | Yu et al. | |
| 2012/0319211 A1 | 12/2012 | van Dal et al. | |

\* cited by examiner

1200

1300

1400

METHODS OF FORMING SEMICONDUCTOR DEVICES, INCLUDING FORMING A SEMICONDUCTOR MATERIAL ON A FIN, AND RELATED SEMICONDUCTOR DEVICES

CROSS-REFERENCE TO RELATED APPLICATIONS

The present application is a continuation application of and claims priority from U.S. patent application Ser. No. 14/600,219, filed on Jan. 20, 2015, which claims priority from U.S. provisional application No. 61/931,342, filed on Jan. 24, 2014, in the USPTO, and Korean Patent Application No. 10-2014-0119307, filed on Sep. 5, 2014, in the Korean Intellectual Property Office, the disclosures of which are hereby incorporated herein by reference in their entireties.

BACKGROUND

The present disclosure relates to semiconductor devices and methods of forming semiconductor devices. As semiconductor devices have reduced in size, semiconductor elements of the semiconductor devices have also reduced in size. Many studies may be conducted to improve the performance of such small-sized semiconductor devices.

SUMMARY

Various embodiments provide a method for fabricating a semiconductor device having improved performance in a relatively simplified manner. For example, according to various embodiments of present inventive concepts, a method for fabricating a semiconductor device may include forming a fin upwardly protruding from a base including a first semiconductor material, by etching the base. The method may include conformally forming an active layer including a second semiconductor material different from the first semiconductor material, on the fin. The method may include exposing a top surface of the fin by removing portions of the active layer that are on the top surface of the fin. The method may include forming first and second active fins including the second semiconductor material, by removing at least a portion of the fin including the exposed top surface. The method may include conformally forming a gate insulation layer on the first and second active fins. Moreover, the method may include forming a gate electrode on the gate insulation layer.

In various embodiments, forming the active layer may include: forming a first active layer including the second semiconductor material; and forming a second active layer including a third semiconductor material different from the first semiconductor material, on the first active layer. In some embodiments, the second semiconductor material may be different from the third semiconductor material. Moreover, in some embodiments, forming the active layer may include forming a third active layer including a fourth semiconductor material that is different from the first semiconductor material. In some embodiments, the second semiconductor material and the fourth semiconductor material include the same semiconductor material. Moreover, in some embodiments, the first semiconductor material includes Germanium (Ge), the second and fourth semiconductor materials include Indium Phosphide (InP), and the third semiconductor material includes Indium Gallium Arsenide (InGaAs).

According to various embodiments, the method may include forming an isolation layer between the first and second active fins, after removing the at least the portion of the fin including the exposed top surface. In some embodiments, top surfaces of the first and second active fins may protrude beyond a top surface of the isolation layer.

In various embodiments, after removing the at least the portion of the fin including the exposed top surface, the method includes: forming a first fin including the first semiconductor material underlying the first active fin and forming a second fin including the first semiconductor material underlying the second active fin, by etching the base using the first and second active fins as masks; and forming an isolation layer filling a space between the first fin and the second fin on the base. In some embodiments, a top surface of the isolation layer may be higher than top surfaces of the first and second fins.

According to various embodiments, the method may include forming a first isolation layer adjacent a bottom portion of the fin and exposing a top portion of the fin, before forming the active layer. In some embodiments, the method may include forming a second isolation layer between the first and second active fins, after removing the at least the portion of the fin including the exposed top surface. Moreover, the first and second active fins may protrude beyond a top surface of the second isolation layer.

In various embodiments, the method may include: forming a sacrificial layer pattern on the base, after forming the and removing the sacrificial layer pattern, after forming the active layer. Moreover, the method may include forming an isolation layer adjacent bottom portions of the first and second active fins, where removing the at least the portion of the fin including the exposed top surface includes removing the at least the portion of the fin including the exposed top surface until the fin including the exposed top surface is coplanar with a top surface of the isolation layer.

A method for fabricating a semiconductor device may include forming a fin upwardly protruding from a base including a first semiconductor material, by etching the base. The method may include forming first through third active layers, at least one of which including a second semiconductor material different from the first semiconductor material, adjacent a first lateral surface of the fin. The method may include forming fourth through sixth active layers, at least one of which including a third semiconductor material that is different from the first semiconductor material, adjacent a second lateral surface of the fin. The method may include forming a first active fin including the first to third active layers and a second active fin including the fourth to sixth active layers, by removing at least a portion of the fin. The method may include forming a gate insulation layer on the first and second active fins. Moreover, the method may include forming a gate electrode on the gate insulation layer.

In various embodiments, the method may include forming an isolation layer between the first and second active fins, after removing the at least the portion of the fin. In some embodiments, the method may include: forming a first fin including the first semiconductor material underlying the first active fin and forming a second fin including the first semiconductor material underlying the second active fin. Moreover, the fin may protrude from the base in a first direction and may extend in a second direction perpendicular to the first direction, the first and second active fins may extend in the second direction in parallel with the fin, the gate electrode may extend on the first and second active fins in a third direction that intersects the first and second directions, and an end portion of the first active fin may be curved adjacent a bottom portion of the fin to extend in the third direction.

A semiconductor device, according to various embodiments, may include a base including a first semiconductor material. The semiconductor device may include a first active fin upwardly protruding from the base and including a second semiconductor material that is different from the first semiconductor material. The semiconductor device may include a second active fin upwardly protruding from the base, the second active fin including the second semiconductor material and being spaced apart from the first active fin. The semiconductor device may include a gate insulation layer on a first lateral surface, a first top surface, and a second lateral surface of the first active fin, and on a third lateral surface, a second top surface, and a fourth lateral surface of the second active fin. Moreover, the semiconductor device may include a gate electrode on the gate insulation layer.

In various embodiments, the semiconductor device may include a fin upwardly protruding from the base between the first and second active fins and including the first semiconductor material. In some embodiments, the first semiconductor material may include a Group IV semiconductor, and the second semiconductor material may include a Group compound semiconductor. Moreover, the first semiconductor material may include Germanium (Ge) and the second semiconductor material may include at least one of Indium Phosphide (InP) and Indium Gallium Arsenide (InGaAs).

According to various embodiments, the semiconductor device may include an isolation layer between the first and second active fins, where bottom portions of the first and second active fins extend along a top surface of the base. In some embodiments, the semiconductor device may include a fin upwardly protruding from the base between the first and second active fins and including the first semiconductor material. Moreover, the semiconductor device may include an isolation layer on the fin, and the first and second active fins may be spaced apart from the fin by the isolation layer.

In various embodiments, the first active fin may include first and second active layers that are sequentially stacked. The first active layer may include the second semiconductor material, and the second active layer may include a third semiconductor material that is different from the second semiconductor material. In some embodiments, the first semiconductor material may include Germanium (Ge), the second semiconductor material may include Indium Phosphide (InP), and the third semiconductor material may include Indium Gallium Arsenide (InGaAs). Moreover, the first active fin may include a third active layer on the second active layer, and the third active layer may include the second semiconductor material.

According to various embodiments, the semiconductor device may include a fin that includes the first semiconductor material, where the base includes a first region and a second region, where the first and second active fins are in the first region, where the fin is in the second region, and where the gate insulation layer and the gate electrode are on the fin and the first and second active fins. Moreover, the first region may include an NMOS region and the second region may include a PMOS region.

A semiconductor device, according to various embodiments, may include a base including a first semiconductor material. The semiconductor device may include a first fin including the first semiconductor material and upwardly protruding from the base. The semiconductor device may include a second fin upwardly protruding from the base, and the second fin may be spaced apart from the first fin and may include the first semiconductor material. The semiconductor device may include a first active fin upwardly protruding from the base on the first fin and including a second semiconductor material that is different from the first semiconductor material. The semiconductor device may include a second active fin upwardly protruding from the base on the second fin and including the second semiconductor material. The semiconductor device may include a gate insulation layer on the first and second active fins. Moreover, the semiconductor device may include a gate electrode on the gate insulation layer and extending in a first direction.

In various embodiments, the gate insulation layer may be spaced apart from the first and second fins. In some embodiments, the first active fin may include first and second active layers that are sequentially stacked. Moreover, the first active layer may include the second semiconductor material that is different from the first semiconductor material, and the second active layer may include a third semiconductor material that is different from the first and second semiconductor materials.

According to various embodiments, the first active fin may include a third active layer stacked on the second active layer and including the second semiconductor material. In some embodiments, the first semiconductor material may include a Group IV semiconductor, and the second and third semiconductor materials each may include Group III-V compound semiconductors. Moreover, the first semiconductor material may include Germanium (Ge), the second semiconductor material may include Indium Phosphide (InP), and the third semiconductor material may include Indium Gallium Arsenide (InGaAs).

A method of forming a semiconductor device, according to various embodiments, may include forming a semiconductor layer on a semiconductor fin. The semiconductor fin and the semiconductor layer may include different first and second semiconductor materials, respectively. Moreover, the method may include defining first and second active fins that include the second semiconductor material on first and second sidewalls, respectively, of the semiconductor fin, by removing at least a portion of the semiconductor fin. In some embodiments, defining the first and second active fins may include: exposing an uppermost surface of the semiconductor fin, by removing portions of the semiconductor layer from the uppermost surface of the semiconductor fin then etching the uppermost surface of the semiconductor fin. Moreover, forming the semiconductor layer on the semiconductor fin may include epitaxially growing first and second semiconductor layers on the semiconductor fin, where the first semiconductor layer may include the second semiconductor material, and where the second semiconductor layer may include a third semiconductor material that is different from the first and second semiconductor materials.

In various embodiments, the method may include: forming an isolation layer between the first and second active fins and on the semiconductor fin, after removing the at least the portion of the semiconductor fin and forming a gate electrode on the first and second active fins and on the isolation layer therebetween. Moreover, forming the semiconductor layer may include growing a plurality of quantum well layers on the first and second sidewalls of the semiconductor fin, and defining the first and second active fins may include defining first and second quantum well structures that protrude beyond an uppermost surface of the semiconductor fin, by etching the uppermost surface of the semiconductor fin.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
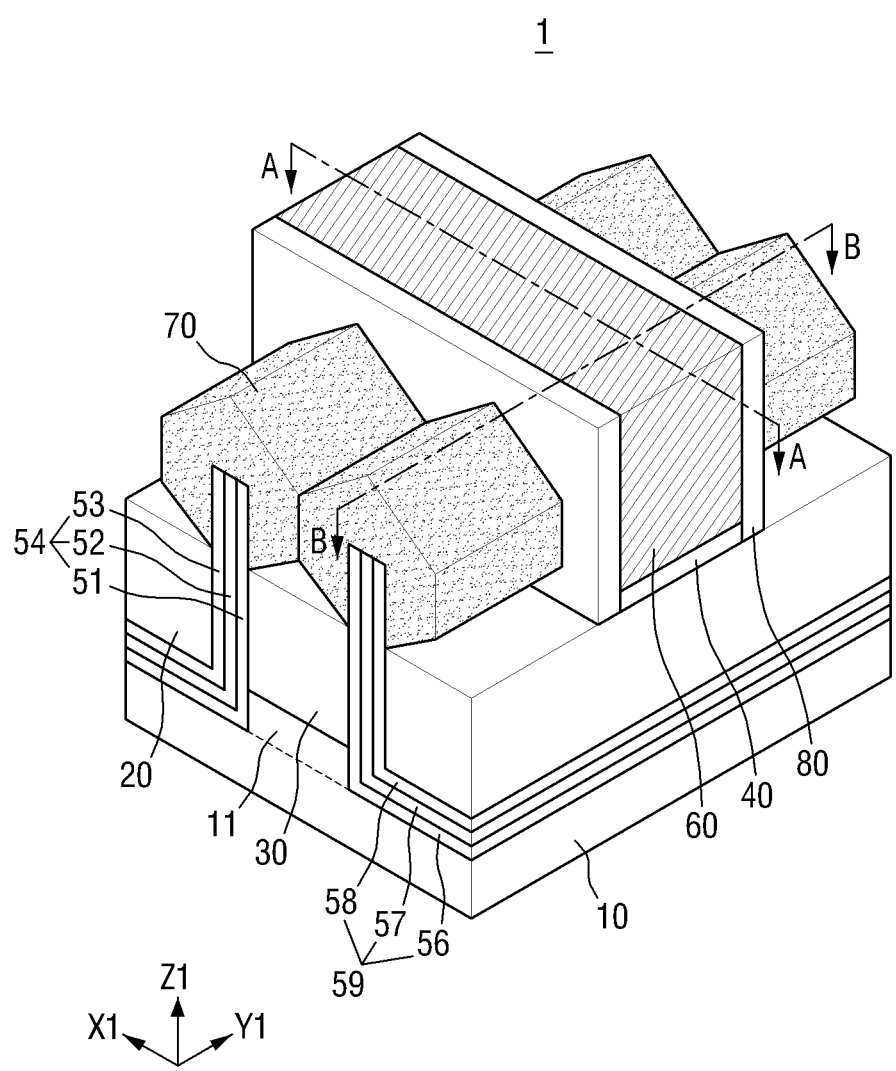
FIG. 1 is a perspective view of a semiconductor device according to some embodiments of present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Hereinafter, a semiconductor device according to some embodiments of present inventive concepts will be described with reference to FIGS. 1 to 3.

Figure 2:
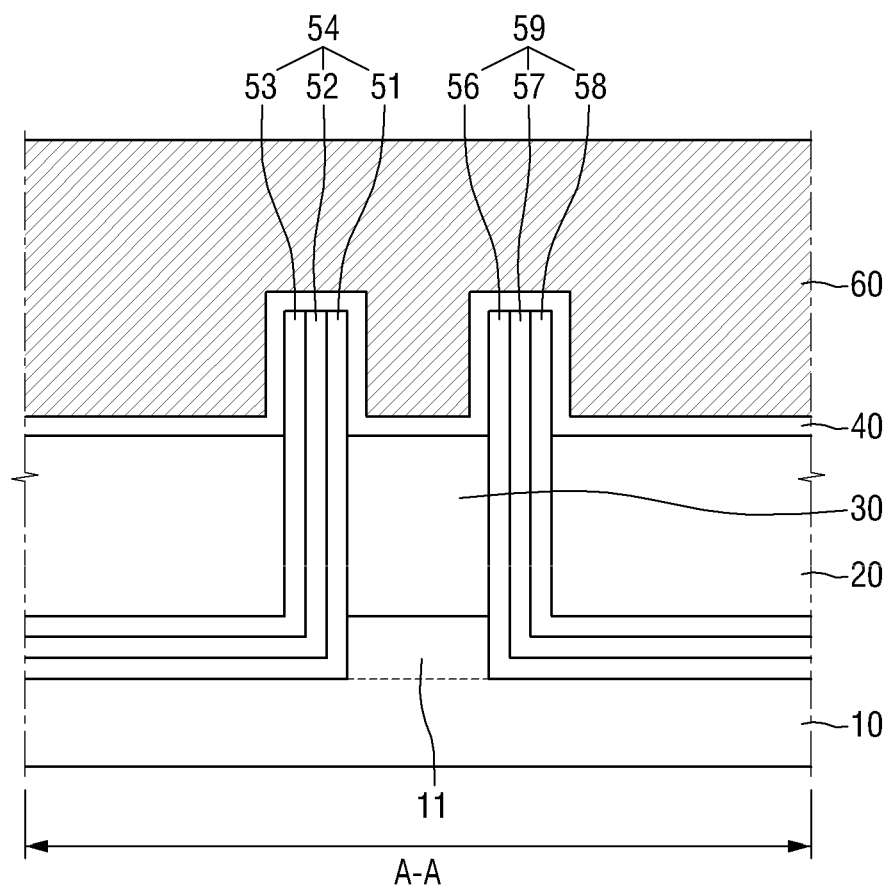
FIG. 2 is a cross-sectional view taken along the line A-A of FIG. 1.
Figure 3:
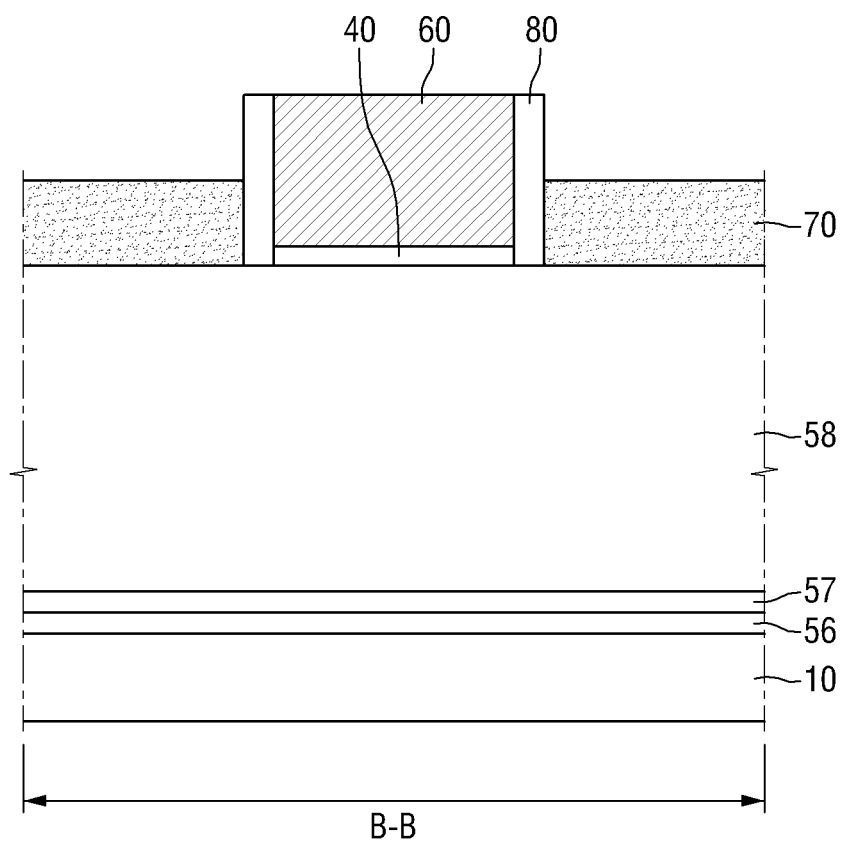
FIG. 3 is a cross-sectional view taken along the line B-B of FIG. 1.

FIG. 1 is a perspective view of a semiconductor device according to some embodiments of present inventive concepts, FIG. 2 is a cross-sectional view taken along the line A-A of FIG. 1, and FIG. 3 is a cross-sectional view taken along the line B-B of FIG. 1.

In FIGS. 1 to 3, the semiconductor device 1 is illustrated as a fin-type transistor (FinFET), but aspects of present inventive concepts are not limited thereto. That is to say, semiconductor devices not illustrated herein may also be used.

Referring to FIGS. 1 to 3, the semiconductor device 1 includes a base 10, a first active fin 54, a second active fin 59, a gate insulation layer 40, and a gate electrode 60.

The base 10 may include a semiconductor. In some embodiments of present inventive concepts, the base 10 may include a Group IV semiconductor including, for example, Silicon (Si) and Germanium (Ge). In more detail, the base 10 may include, for example, Ge, but aspects of present inventive concepts are not limited thereto.

Meanwhile, in some embodiments of present inventive concepts, the base 10 may include Group III-V compounds. Examples of the Group III-V compounds include Gallium Arsenide (GaAs), Gallium Phosphide (GaP), Indium Arsenide (InAs), Indium Phosphide (InP), Indium Gallium Arsenide (InGaAs), and Indium Gallium Phosphide (InGaP), but not limited thereto.

Meanwhile, in some embodiments of present inventive concepts, the base 10 may be an epitaxial layer. That is to say, the base 10 may be formed through an epitaxial growth process.

The first active fin 54 may be formed to protrude from the base 10 in a first direction Z1 and may extend in a second direction Y1. A bottom portion of the first active fin 54 may extend along a top surface of the base 10, as shown.

The second active fin 59 may also be formed to protrude from the base 10 in the first direction Z1 and may extend in the second direction Y1. A bottom portion of the second active fin 59 may also extend along the top surface of the base 10, as shown.

As shown, the second active fin 59 may be formed to be separated from the first active fin 54. In detail, a top portion of the first active fin 54 and a top portion of the second active fin 59 may not be connected to each other but may be separated from each other, as shown.

In some embodiments of present inventive concepts, the first and second active fins 54 and 59 may include a semiconductor different from that of the base 10. For example, the first and second active fins 54 and 59 may include Group III-V compound semiconductors and the base 10 may include a Group IV semiconductor. In detail, for example, the first and second active fins 54 and 59 may include at least one of InP and InGaAs and the base 10 may include Ge, but aspects of present inventive concepts are not limited thereto.

In some embodiments of present inventive concepts, the first active fin 54 may include first to third active layers 51, 52 and 53 sequentially stacked. The first to third active layers 51, 52 and 53 may be, for example, epitaxial layers formed through an epitaxial growth process.

The first active layer 51 may include a different semiconductor from the second active layer 52. In detail, the first active layer 51 may include one of Group III-V compound semiconductors and the second active layer 52 may include a different one of Group III-V compound semiconductors. In more detail, the first active layer 51 may include InP and the second active layer 52 may include InGaAs, but aspects of present inventive concepts are not limited thereto.

The third active layer 53 formed on the second active layer 52 may include a different semiconductor from the second active layer 52. In detail, the third active layer 53 may include one of Group III-V compound semiconductors and the second active layer 52 may include a different one of Group III-V compound semiconductors. In more detail, the third active layer 53 may include InP and the second active layer 52 may include InGaAs, but aspects of present inventive concepts are not limited thereto.

In some embodiments of present inventive concepts, the first to third active layers 51, 52 and 53 may form a quantum well structure.

In some embodiments of present inventive concepts, the second active fin 59 may include fourth to sixth active layers 56, 57 and 58 sequentially stacked. The fourth to sixth active layers 56, 57 and 58 may be, for example, epitaxial layers formed through an epitaxial growth process.

The fourth active layer 56 may include a different semiconductor from the fifth active layer 57. In detail, the fourth active layer 56 may include one of Group III-V compound semiconductors and the fifth active layer 57 may include a different one of Group III-V compound semiconductors. In more detail, the fourth active layer 56 may include InP and the fifth active layer 57 may include InGaAs, but aspects of present inventive concepts are not limited thereto.

The sixth active layer 58 formed on the fifth active layer 57 may include a different semiconductor from the fifth active layer 57. In detail, sixth active layer 58 may include one of Group III-V compound semiconductors and the fifth active layer 57 may include a different one of Group III-V compound semiconductors. In more detail, the sixth active layer 58 may include InP and the fifth active layer 57 may include InGaAs, but aspects of present inventive concepts are not limited thereto.

In some embodiments of present inventive concepts, the fourth to sixth active layers 56, 57 and 58 may form a quantum well structure.

In some embodiments of present inventive concepts, the first active fin 54 and the second active fin 59 each including three active layers are provided as one example, but aspects of present inventive concepts are not limited thereto. In some embodiments of present inventive concepts, each of the first active fin 54 and the second active fin 59 may be modified to include two active layers.

In some embodiments of present inventive concepts, each of the first active fin 54 and the second active fin 59 may also be modified to have n active layers, where n is a natural number of 4 or greater.

A fin 11 may be formed between the first and second active fins 54 and 59, the fin 11 protruding from the base 10 in the first direction Z1 and extending in the second direction Y1. In some embodiments of present inventive concepts, because the fin 11 is formed by etching the base 10, it may include the same semiconductor as the base 10.

In detail, the fin 11 may include, for example, a Group IV semiconductor, such as Si or Ge. In more detail, the fin 11 may include, for example, Ge, but aspects of present inventive concepts are not limited thereto.

As shown, a top surface of the fin 11 may be lower than top surfaces of the first and second active fins 54 and 59. In detail, as shown, the top surface of the fin 11 may be positioned to be adjacent to bottom portions of the first and second active fins 54 and 59.

A first isolation layer 20 may be formed at exterior sides of the first and second active fins 54 and 59. As shown, the first isolation layer 20 may be formed on the first and second active fins 54 and 59.

A second isolation layer 30 may be formed at/on interior sides of the first and second active fins 54 and 59, that is, between the first and second active fins 54 and 59. The second isolation layer 30 may be formed on the fin 11.

In some embodiments of present inventive concepts, the first isolation layer 20 and the second isolation layer 30 may include different insulation layers. When the first isolation layer 20 includes, for example, an oxide layer, the second isolation layer 30 may include, for example, a nitride layer. Conversely, when the first isolation layer 20 includes, for example, a nitride layer, the second isolation layer 30 may include, for example, an oxide layer, but aspects of present inventive concepts are not limited thereto. In some embodiments of present inventive concepts, the first isolation layer 20 and the second isolation layer 30 may include the same insulation layer.

In some embodiments of present inventive concepts, the fin 11 may not be provided (i.e., the fin 11 may be omitted). In this case, the second isolation layer 30 may be brought into contact with the top surface of the base 10 between the first active fin 54 and the second active fin 59.

The gate insulation layer 40 may be formed on the first and second active fins 54 and 59 to extend in a third direction X1. In detail, the gate insulation layer 40 may be formed to cover at least a portion of a top surface of the first isolation layer 20, one lateral surface, a top surface and the other lateral surface of the first active fin 54, a top surface of the second isolation layer 30 and one lateral surface, a top surface and the other lateral surface of the second active fin 59.

In some embodiments of present inventive concepts, the gate insulation layer 40 may include a high-k material having a higher dielectric constant than a silicon oxide layer (for example, a high-k material having a dielectric constant (k) of 9 or greater).

Examples of the high-k film may include at least one selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but not limited thereto.

In some embodiments of present inventive concepts, the gate insulation layer 40 may include an interface layer for reducing/preventing interface failure between each of the first and second active fins 54 and 59 and the high-k material. The interface layer may include, for example, an oxide layer. In detail, the interface layer may include a low-k material layer having a dielectric constant (k) of 9 or less.

In some embodiments of present inventive concepts, the interface layer may be formed by, for example, a wet process or a heat oxidation process.

The gate electrode 60 may extend on the gate insulation layer 40 in the third direction X1.

In some embodiments of present inventive concepts, the gate electrode 60 may include a work function control film and a metal gate electrode. The work function control film may be used in controlling a work function of a semiconductor device.

For example, when the semiconductor device is of an n type, the work function control film may include an n type work function material. Examples of the n type work function material may include Titanium Aluminide (TiAl), Titanium Aluminum Nitride (TiAlN), Tantalum Carbide (TaC), Tantalum Aluminum Nitride (TaAlN), Titanium Carbide (TiC), Hafnium Silicide (HfSi), and the like, but aspects of present inventive concepts are not limited thereto.

Meanwhile, when the semiconductor device is of, for example, a p type, the work function control film may include a p type work function material. Examples of the p type work function material may include Titanium Nitride (TiN), Tantalum Nitride (TaN), and the like. In detail, the p type work function control film may be, for example, a single layer made of TiN, or have a double layered structure including a TiN lower layer and a TaN upper layer, but aspects of present inventive concepts are not limited thereto.

In some embodiments of present inventive concepts, when a semiconductor device is of a p type, the work function control film may have a double layered structure including a lower p type work function control film and an upper n type work function control film.

The metal gate electrode may include a highly conductive metal. Examples of the metal may include Aluminum (Al) or Tungsten (W), but aspects of present inventive concepts are not limited thereto.

A spacer 80 may be formed at opposite sides of the gate electrode 60. The spacer 80 may include at least one of a nitride layer and an oxynitride layer.

In FIGS. 1 to 3, the spacer 80 having an I-letter shape is illustrated, but aspects of some embodiments of present inventive concepts are not limited thereto. In some embodiments of present inventive concepts, the spacer 80 may be modified to have an L-letter shape. In addition, in some embodiments of present inventive concepts, the shape of the spacer 80 may be modified such that a width of its bottom portion is greater than that of its top portion.

A semiconductor pattern 70 may be formed on/at exterior sides of the spacer 80. In detail, the semiconductor pattern 70 may be formed on the first and second active fins 54 and 59 disposed at exterior sides of the spacer 80.

The semiconductor pattern 70 may function as a source or drain of the illustrated semiconductor device (for example, a fin type transistor).

When the fin type transistor formed using the first and second active fins 54 and 59 is a PMOS transistor, the semiconductor pattern 70 may include a compressive stress material. The compressive stress material may improve the mobility of carriers of a channel region by applying compressive stress to the first and second active fins 54 and 59.

However, when the fin type transistor formed using the first and second active fins 54 and 59 is an NMOS transistor, the semiconductor pattern 70 may include a tensile stress material. The tensile stress material may improve the mobility of carriers of a channel region by applying tensile stress to the first and second active fins 54 and 59.

The semiconductor pattern 70 may be formed through an epitaxial growth process, for example. In some embodiments of present inventive concepts, when necessary, an impurity may be in-situ doped into the semiconductor pattern 70 during the epitaxial growth process for forming the semiconductor pattern 70.

The semiconductor pattern 70 may have a shape of at least one of a diamond, a circle and a rectangle. In FIG. 1, a diamond shape (or a pentagonal or hexagonal shape) is illustrated by way of example, but aspects of present inventive concepts are not limited thereto.

In addition, in FIG. 1, the semiconductor pattern 70 formed on the first active fin 54 and the semiconductor pattern 70 formed on the second active fin 59 are brought into contact with each other, but aspects of present inventive concepts are not limited thereto.

In the semiconductor device 1 as illustrated in FIGS. 1-3, the first and second active fins 54 and 59 forming a quantum well structure are used as channels of a semiconductor device (for example, a PMOS transistor). Accordingly, the performance of the semiconductor device 1 can be improved. As will later be described in detail, the first and second active fins 54 and 59 can be formed in a more simplified manner, thereby simplifying the fabricating method of the semiconductor device 1.

Figure 4:
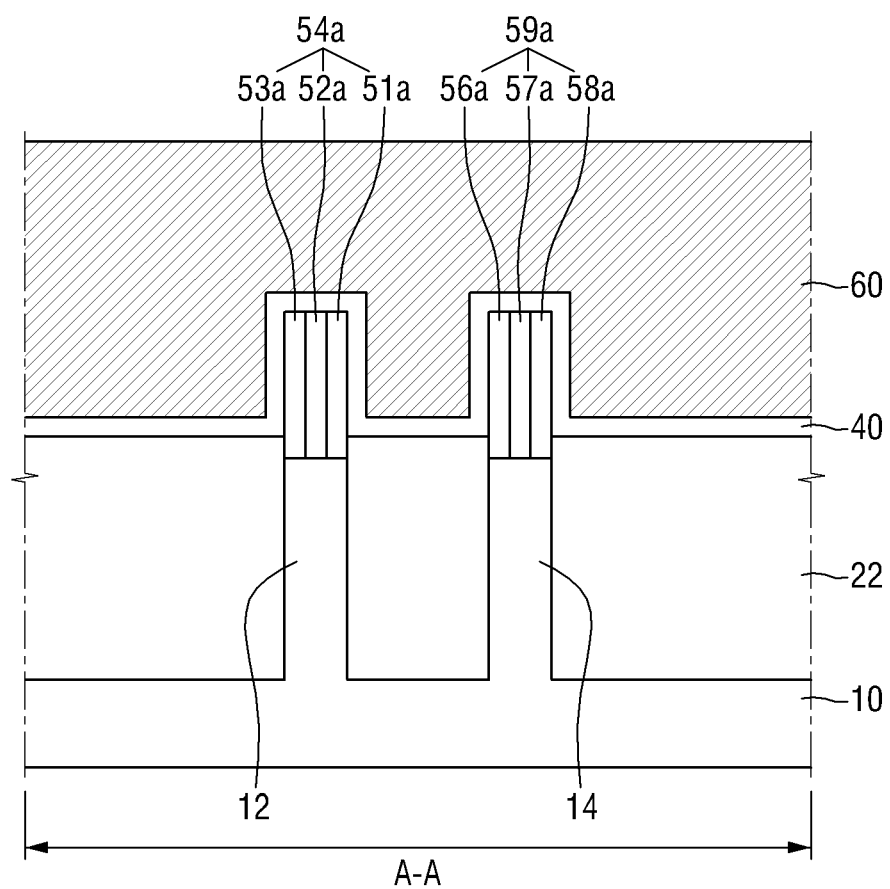
FIG. 4 is a cross-sectional view of a semiconductor device according to some embodiments of present inventive concepts.

FIG. 4 is a cross-sectional view of a semiconductor device according to some embodiments of present inventive concepts.

The following description will focus on differences between FIG. 4 and FIGS. 1-3.

Referring to FIG. 4, the semiconductor device 2 according to the illustrated embodiment may include a first fin 12, a second fin 14, a first active fin 54a and a second active fin 59a.

The first fin 12 may be formed to upwardly protrude from the base 10 by etching a portion of the base 10. As shown, the second fin 14 is spaced apart from the first fin 12 and may be formed to upwardly protrude from the base 10 by etching a portion of the base 10.

The first and second fins 12 and 14 may include the same semiconductor as the base 10. In some embodiments of present inventive concepts, the base 10 and the first and second fins 12 and 14 may include a Group IV semiconductor, but aspects of present inventive concepts are not limited thereto.

The first active fin 54a may be formed on the first fin 12 and the second active fin 59a may be formed on the second fin 14 to be spaced apart from the first active fin 546a.

In some embodiments of present inventive concepts, the first and second active fins 54a and 59a may include different semiconductors from the base 10. For example, the first and second active fins 54a and 59a may include Group III-V compound semiconductors.

In some embodiments of present inventive concepts, the first active fin 54a may include first to third active layers 51la, 52a and 53a that are sequentially stacked. The first to third active layers 51a, 52a and 53a may be, for example, epitaxial layers formed through an epitaxial growth process.

In some embodiments of present inventive concepts, the first active layer 51a may include, for example, InP, the second active layer 52a may include, for example, InGaAs and the third active layer 53a may include, for example, InP, but aspects of present inventive concepts are not limited thereto.

In some embodiments of present inventive concepts, the second active fin 59a may include fourth to sixth active layers 56a, 576a and 58a that are sequentially stacked. The fourth to sixth active layers 56a, 57a and 58a may be, for example, epitaxial layers formed through an epitaxial growth process.

In some embodiments of present inventive concepts, the fourth active layer 56a may include, for example, InP, the fifth active layer 57a may include, for example, InGaAs and the sixth active layer 58a may include, for example, InP, but aspects of present inventive concepts are not limited thereto.

The isolation layer 22 may be formed to cover the first and second fins 12 and 14 and some portions of bottom portions of the first and second active fins 54a and 59a. That is to say, the isolation layer 22 may be formed to overlap with portions of the first and second active fins 54a and 59a, but aspects of present inventive concepts are not limited thereto.

Embodiments of present inventive concepts may be modified in various manners. For example, in some embodiments of present inventive concepts, a top surface of the isolation layer 22 may be coplanarly positioned with top surfaces of the first and second fins 12 and 14.

As illustrated in FIG. 4, because the first and second fins 12 and 14 are not used as channels of a transistor, the gate insulation layer 40 may not be brought into contact with the first and second fins 12 and 14.

Figure 5:
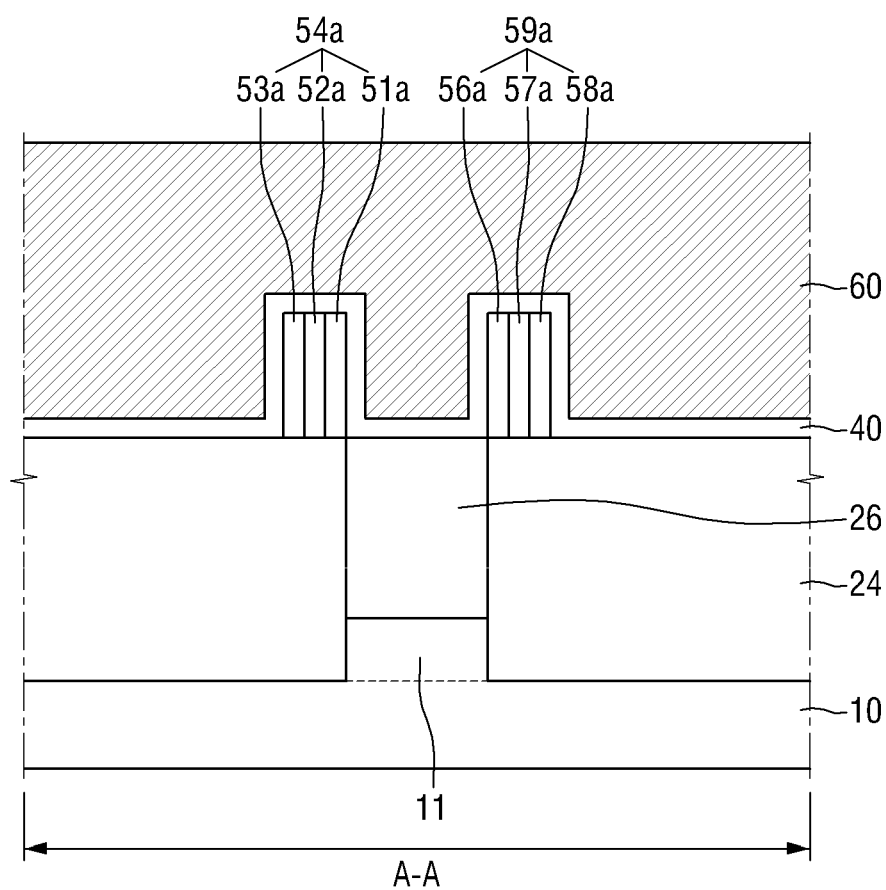
FIG. 5 is a cross-sectional view of a semiconductor device according to some embodiments of present inventive concepts.

FIG. 5 is a cross-sectional view of a semiconductor device according to some embodiments of present inventive concepts. The following description will focus on differences between FIG. 5 and FIGS. 1-4.

Referring to FIG. 5, in the semiconductor device 3 according to the illustrated embodiment, bottom portions of a first active fin 54a and a second active fin 59a may not extend along a top surface of a base 10 and the first active fin 54a and the second active fin 59a may be formed on a first isolation layer 24 disposed thereunder.

A second isolation layer 26 and a fin 11 may be formed between the first active fin 54a and the second active fin 59a.

In some embodiments of present inventive concepts, the second isolation layer 26 may include a different insulation layer from the first isolation layer 24 but aspects of present inventive concepts are not limited thereto. Kinds/types of the first isolation layer 24 and the second isolation layer 26 may vary in various manners.

The fin 11 may be positioned below the second isolation layer 26. As shown, the fin 11 may be spaced apart from the first active fin 54*a* and the second active fin 59*a* by first and second isolation layers 24 and 26.

As described above, the fin 11 may optionally not be provided, depending on processing conditions.

Figure 6:
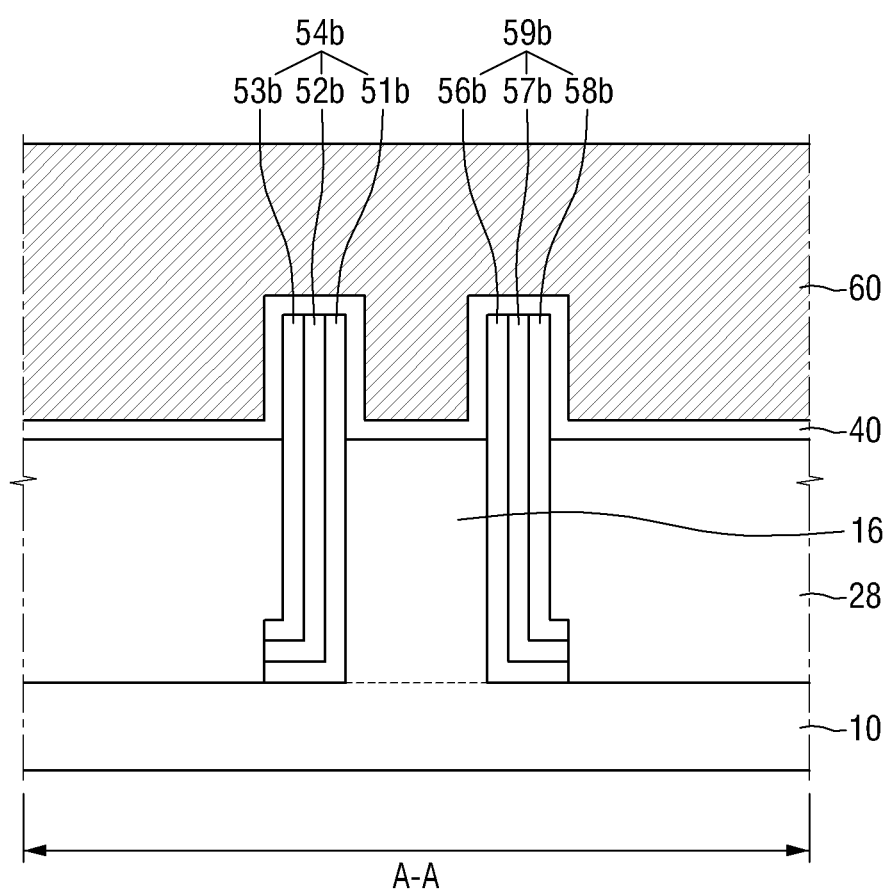
FIG. 6 is a cross-sectional view of a semiconductor device according to some embodiments of present inventive concepts.

FIG. 6 is a cross-sectional view of a semiconductor device according to some embodiments of present inventive concepts. The following description will focus on differences between FIG. 6 and FIGS. 1-5.

Referring to FIG. 6, in the semiconductor device 4 according to some embodiments of present inventive concepts, bottom portions of a first active fin 54*b* and a second active fin 59*b* may be bent/curved to extend in a third direction (X1 of FIG. 1).

In detail, the first active fin 54*b* may include a first active layer 51*b* having a bottom portion bent/curved to extend in the third direction (X1 of FIG. 1), a second active layer 52*b* having a bottom portion bent/curved to extend in the third direction (X1 of FIG. 1), and a third active layer 53*b* having a bottom portion bent/curved to extend in the third direction (X1 of FIG. 1).

In some embodiments of present inventive concepts, the first active layer 51*b* may include, for example, InP, the second active layer 52*b* may include, for example, InGaAs, and the third active layer 53*b* may include, for example, InP, but aspects of present inventive concepts are not limited thereto.

The second active fin 59*b* may include a fourth active layer 56*b* having a bottom portion bent/curved to extend in the third direction (X1 of FIG. 1), a fifth active layer 57*b* having a bottom portion bent/curved to extend in the third direction (X1 of FIG. 1), and a sixth active layer 58*b* having a bottom portion bent/curved to extend in the third direction (X1 of FIG. 1).

In some embodiments of present inventive concepts, the fourth active layer 56*b* may include, for example, InP, the fifth active layer 57*b* may include, for example, InGaAs, and the sixth active layer 58*b* may include, for example, InP, but aspects of present inventive concepts are not limited thereto.

A fin 16 may be positioned between the first active fin 54*b* and the second active fin 59*b*, the fin 16 upwardly protruding from the base 10 and formed in one body with the base 10. That is to say, according to FIG. 6, the first active fin 54*b* and the second active fin 59*b* may be separated from each other by the fin 16.

The fin 16 may include the same semiconductor as the base 10. In detail, the fin 16 may include, for example, a Group IV semiconductor, such as Ge, but aspects of present inventive concepts are not limited thereto.

In some embodiments according to FIG. 6, a gate insulation layer 40 may be formed on a top surface of the fin 16. That is to say, the gate insulation layer 40 and the fin 16 may be brought into contact with each other.

Figure 7:
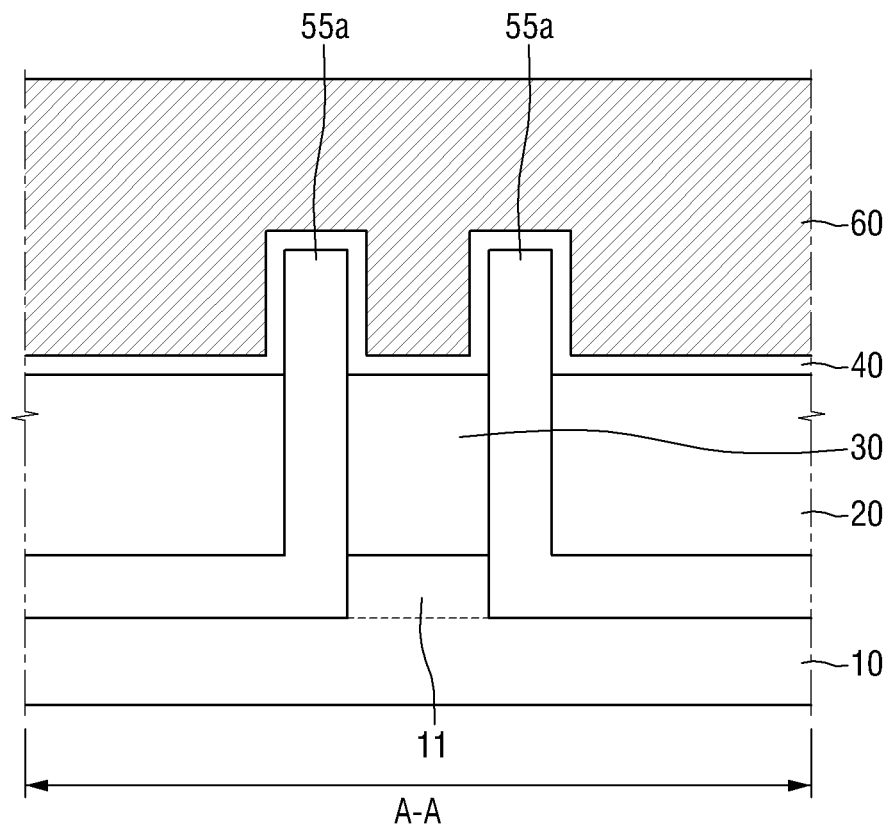
FIG. 7 is a cross-sectional view of a semiconductor device according to some embodiments of present inventive concepts.

FIG. 7 is a cross-sectional view of a semiconductor device according to some embodiments of present inventive concepts. The following description will focus on differences between FIG. 7 and FIGS. 1-6.

Referring to FIG. 7, the semiconductor device 5 in some embodiments according to FIG. 7 is different from the semiconductor device 1 shown in FIGS. 1 to 3 in that first and second active fins 55*a* have a single layered structure.

That is to say, in the semiconductor device 5 according to the illustrated embodiment, each of the first and second active fins 55*a* may be formed of a single layer including a different semiconductor from a base 10. In detail, each of the first and second active fins 55*a* may have, for example, a single layered structure including Group III-V compound semiconductors, but aspects of present inventive concepts are not limited thereto.

Figure 8:
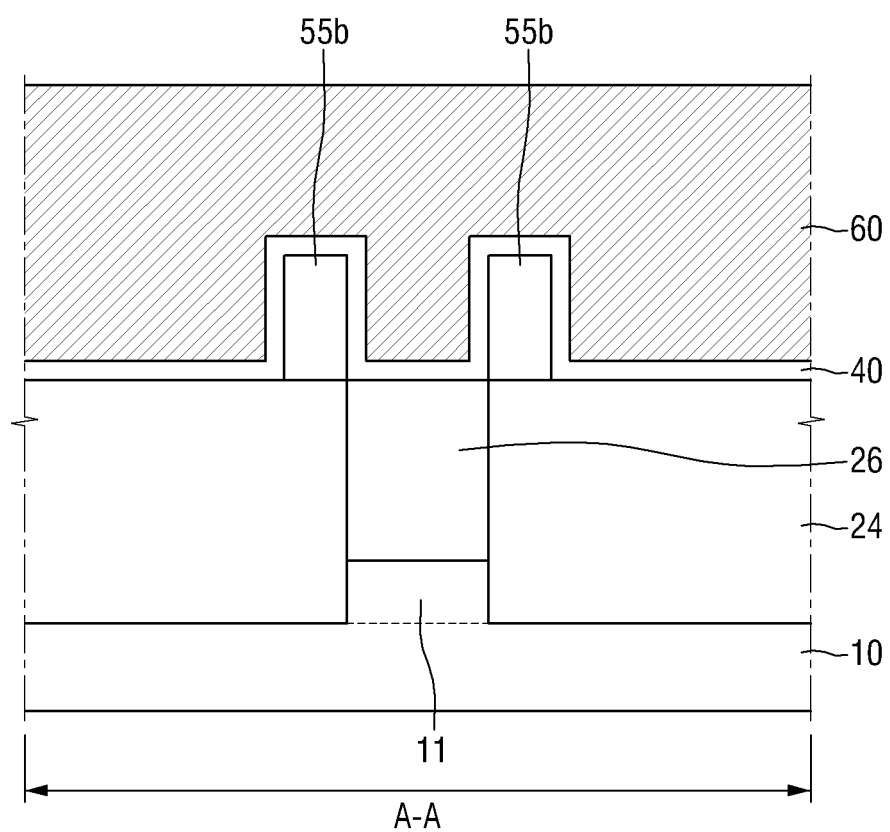
FIG. 8 is a cross-sectional view of a semiconductor device according to some embodiments of present inventive concepts.

FIG. 8 is a cross-sectional view of a semiconductor device according to some embodiments of present inventive concepts. The following description will focus on differences between FIG. 8 and FIGS. 1-7.

Referring to FIG. 8, the semiconductor device 6 illustrated therein is different from the semiconductor device 3 shown in FIG. 5 in that each of first and second active fins 55*b* has a single layered structure.

That is to say, in the semiconductor device 6 according to FIG. 8, each of the first and second active fins 55*b* may be formed of a single layer including a different semiconductor from a base 10. In detail, each of the first and second active fins 55*b* may have, for example, a single layered structure including Group III-V compound semiconductors, but aspects of present inventive concepts are not limited thereto.

Figure 9:
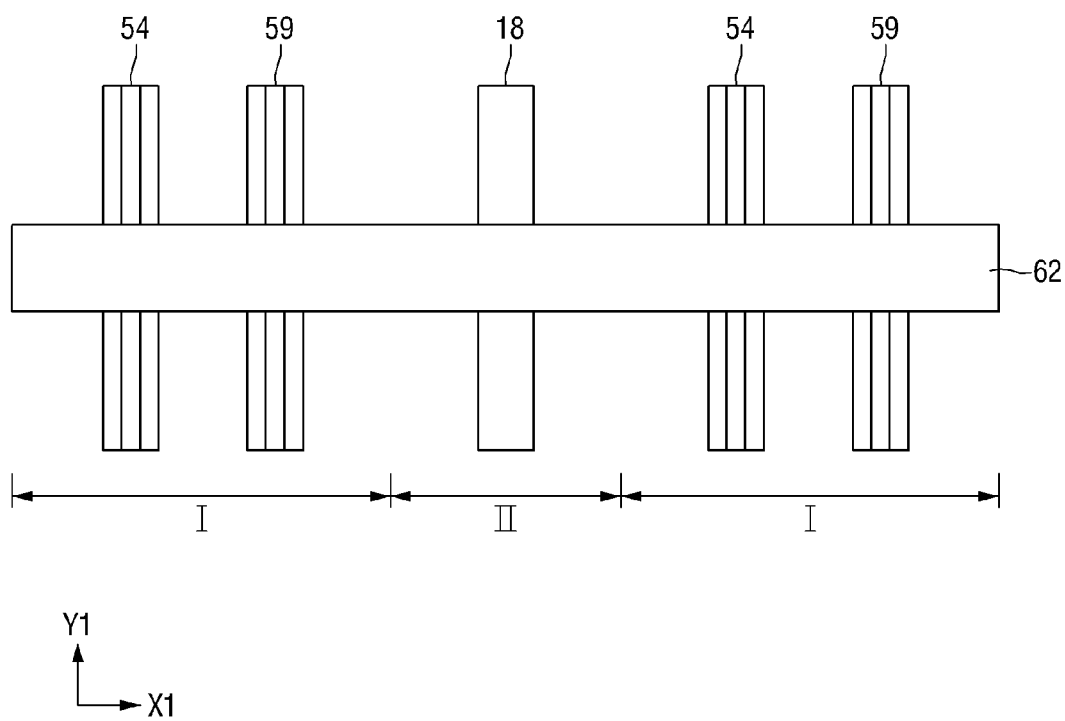
FIG. 9 is a schematic layout view of a semiconductor device according to some embodiments of present inventive concepts.

FIG. 9 is a schematic layout view of a semiconductor device according to some embodiments of present inventive concepts. The following description will focus on differences between FIG. 9 and FIGS. 1-8.

Referring to FIG. 9, the semiconductor device according to some embodiments may include a first region I and a second region II.

A first active fin 54 may extend in the first region I in a second direction Y1 and a second active fin 59 may extend in the second direction Y1 to be parallel with the first active fin 54.

Here, the first and second active fins 54 and 59 may be the same as the first and second active fins 54 and 59 of the semiconductor device 1 shown in FIGS. 1 to 3, for example.

However, present inventive concepts do not limit the shapes of the first and second active fins 54 and 59 to those illustrated herein. Rather, when necessary, the first and second active fins 54 and 59 may be modified to have the shapes illustrated in one of the semiconductor devices 2 to 6.

A fin 18 may extend in the second region II in the second direction Y1. Here, the fin 18 may be formed by etching a base (for example, the base 10 of FIG. 1). Therefore, the fin 18 may include the same semiconductor as the base (for example, the base 10 of FIG. 1).

In some embodiments of present inventive concepts, the first and second active fins 54 and 59 formed in the first region I and the fin 18 formed in the second region II may include different semiconductors. In detail, for example, the first and second active fins 54 and 59 formed in the first region I may include Group III-V compound semiconductors and the fin 18 formed in the second region II may include a Group IV semiconductor. In more detail, for example, the first and second active fins 54 and 59 formed in the first region I may have a three-layered structure including InP, InGaAs and InP, and the fin 18 formed in the second region II may have a single layered structure including Ge, but aspects of present inventive concepts are not limited thereto.

In some embodiments of present inventive concepts, the first region I may be an NMOS region and the second region II may be a PMOS region, but aspects of present inventive concepts are not limited thereto.

A gate electrode 62 may extend on the first and second active fins 54 and 59 formed in the first region I and the fin 18 formed in the second region II in the third direction X1. A NMOS transistor may be defined at an intersection between the gate electrode 62 and each of the first and second active fins 54 and 59 and a PMOS transistor may be defined at an intersection between the gate electrode 62 and the fin 18.

FIGS. 10 to 19 are diagrams illustrating a method for fabricating a semiconductor device according to some embodiments of present inventive concepts.

Figure 10:
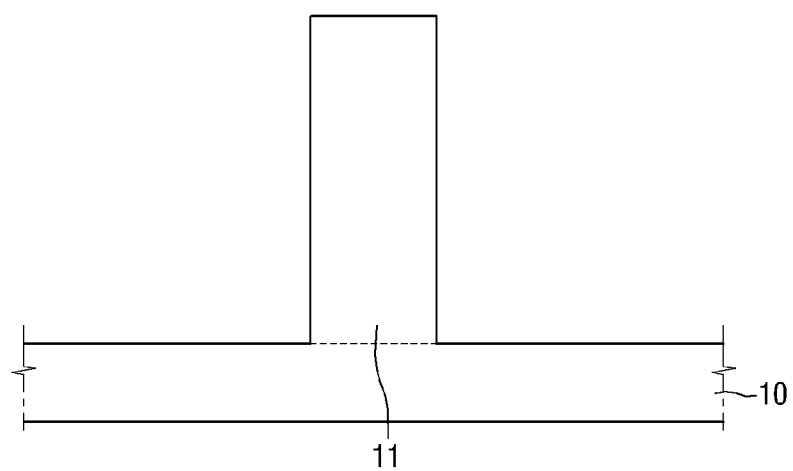
FIGS. 10 to 19 are diagrams illustrating a method for fabricating a semiconductor device according to some embodiments of present inventive concepts.

Referring first to FIG. 10, a fin 11 is formed by etching a base 10.

In some embodiments of present inventive concepts, the base 10 may include a Group IV semiconductor. In detail, the base 10 may include, for example, Ge, but aspects of present inventive concepts are not limited thereto.

The fin 11 formed by etching the base 10 may include the same semiconductor as the base 10. In some embodiments of present inventive concepts, as shown, the base 10 and the fin 11 may be formed in one body, but aspects of present inventive concepts are not limited thereto.

Figure 11:
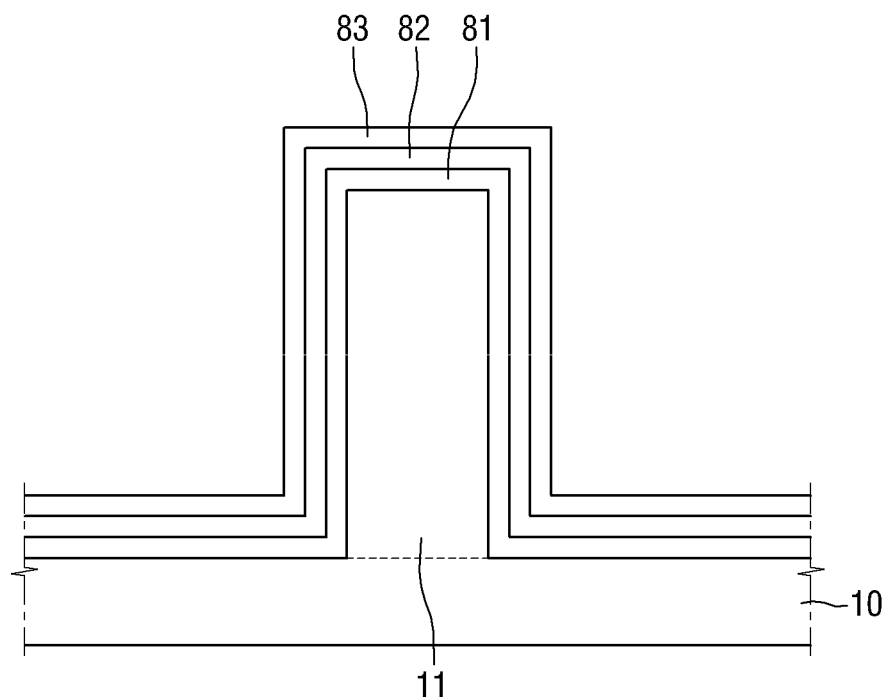

Next, referring to FIG. 11, an 11th active layer 81 is conformally formed on the base 10 and the fin 11.

In some embodiments of present inventive concepts, the 11th active layer 81 may be formed by, for example, an epitaxial growth process.

The 11th active layer 81 may include a different semiconductor from the base 10 and the fin 11. For example, the 11th active layer 81 may include Group III-V compound semiconductors and the base 10 and the fin 11 may include a Group IV semiconductor. In more detail, the 11th active layer 81 may include InP and the base 10 and the fin 11 may include Ge, but aspects of present inventive concepts are not limited thereto.

Next, a 12th active layer 82 is conformally formed on the 11th active layer 81.

In some embodiments of present inventive concepts, the 12th active layer 82 may be formed by, for example, an epitaxial growth process.

The 12th active layer 82 may include a different semiconductor from the base 10, the fin 11 and the 11th active layer 81. For example, the base 10 and the fin 11 may include a Group IV semiconductor, the 11th active layer 81 may include one example of Group III-V compound semiconductors, and the 12th active layer 82 may include another (i.e., a different) example of the Group III-V compound semiconductors.

In more detail, the base 10 and the fin 11 may include Ge, the 11th active layer 81 may include InP, and the 12th active layer 82 may include InGaAs, but aspects of present inventive concepts are not limited thereto.

Next, a 13th active layer 83 is conformally formed on the 12th active layer 82.

In some embodiments of present inventive concepts, the 13th active layer 83 may be formed by, for example, an epitaxial growth process.

The 13th active layer 83 may include a different semiconductor from the base 10, the fin 11, and the 12th active layer 82. For example, the base 10 and the fin 11 may include a Group IV semiconductor, the 12th active layer 82 may include one example of Group III-V compound semiconductors and the 13th active layer 83 may include another (i.e., a different) example of the Group III-V compound semiconductors.

In more detail, the base 10 and the fin 11 may include Ge, the 12th active layer 82 may include InGaAs and the 13th active layer 83 may include InP, but aspects of present inventive concepts are not limited thereto.

In some embodiments of present inventive concepts, the 13th active layer 83 may include the same semiconductor as the 11th active layer 81. In detail, the 13th active layer 83 and the 11th active layer 81 may include InP, but aspects of present inventive concepts are not limited thereto.

The 11th to 13th active layers 81 to 83 may be sequentially stacked and may form a quantum well structure.

Figure 12:
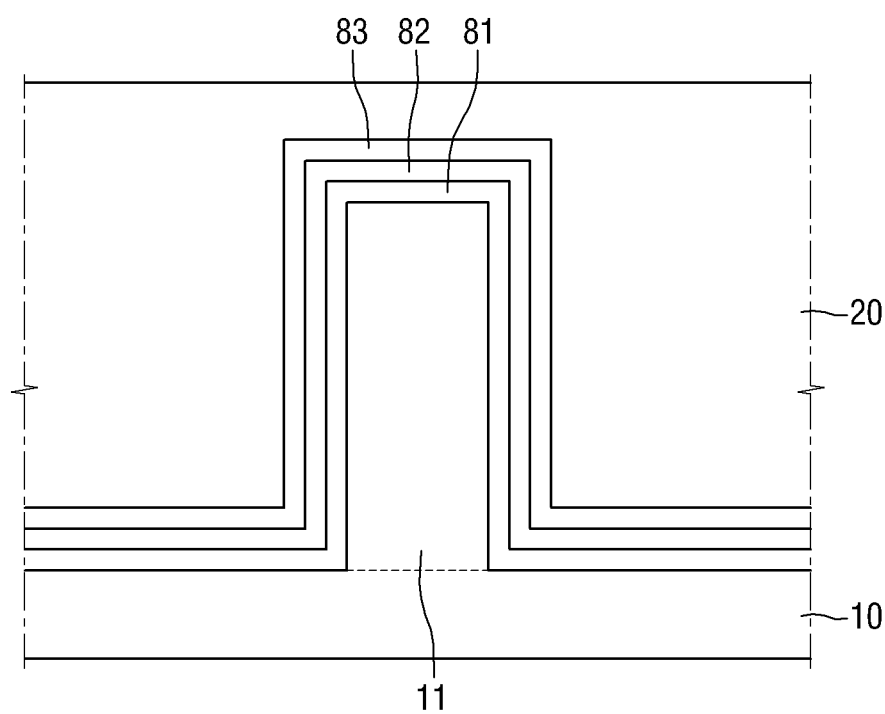

Next, referring to FIG. 12, a first isolation layer 20 covering the 11th to 13th active layers 81 to 83 is formed. The first isolation layer 20 may be formed to completely cover the 11th to 13th active layers 81 to 83, as shown.

The first isolation layer 20 may include an insulation layer. In detail, the first isolation layer 20 may include at least one of an oxide layer, a nitride layer, and an oxynitride layer, but aspects of present inventive concepts are not limited thereto.

Figure 13:
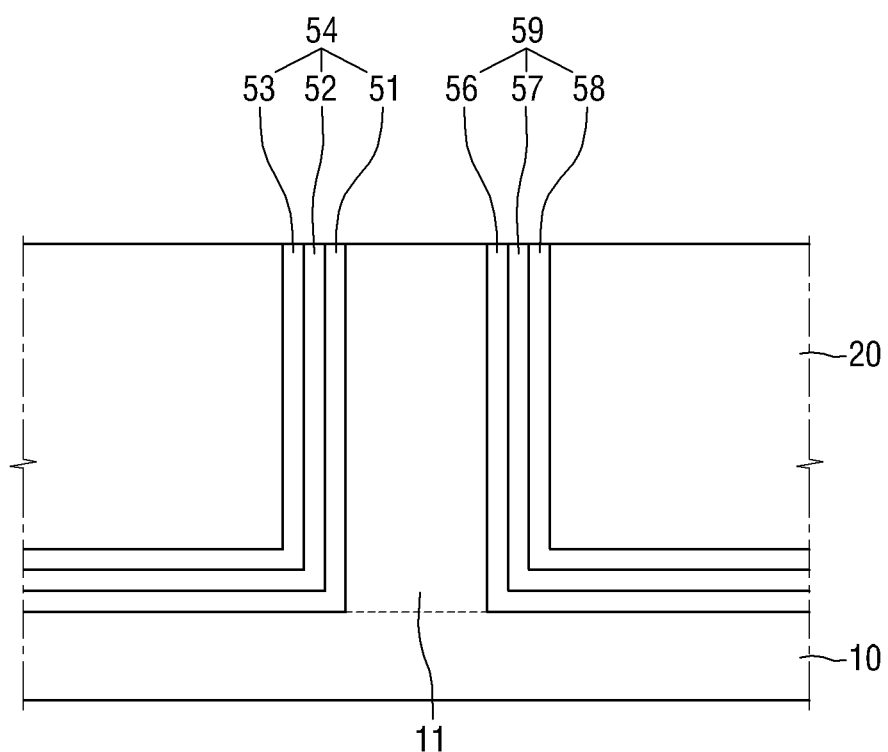

Next, referring to FIG. 13, portions of the first isolation layer 20 and the 11th to 13th active layers 81 to 83 covering a top surface of the fin 11 are removed.

In some embodiments of present inventive concepts, the portions of the first isolation layer 20 and the 11th to 13th active layers 81 to 83 covering the top surface of the fin 11 may be removed by, for example, a chemical mechanical polishing (CMP).

As a result of removing the portions of the first isolation layer 20 and the 11th to 13th active layers 81 to 83 covering the top surface of the fin 11 as shown, a first active fin 54 and a second active fin 59, which are separated from each other, may be formed.

As shown, bottom portions of the first active fin 54 and the second active fin 59 may extend along a top surface of the base 10.

The first active fin 54 may include first to third active fin layers 51, 52 and 53 that are sequentially stacked, and the second active fin 59 may include fourth to sixth active fin layers 56, 57 and 58 that are sequentially stacked.

As a result of removing the portions of the first isolation layer 20 and the 11th to 13th active layers 81 to 83 covering the top surface of the fin 11 as shown, a top surface of the fin 11 may be exposed.

Figure 14:
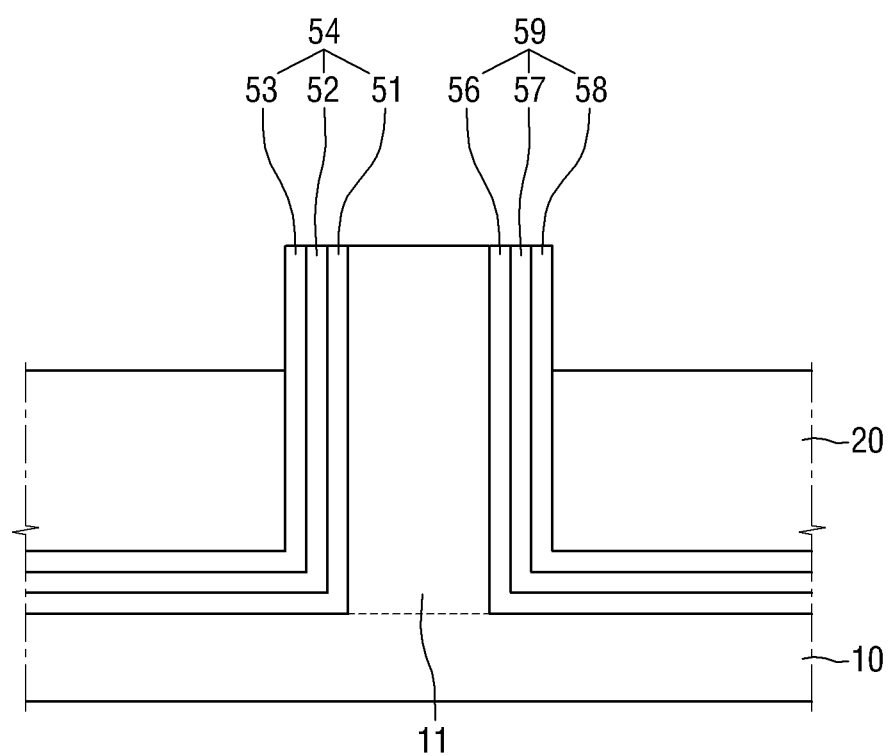

Next, referring to FIG. 14, a portion (e.g., a further portion) of the first isolation layer 20 is removed, thereby exposing outer surfaces/sidewalls of the first and second active fins 54 and 59.

Here, as shown, outer surfaces/sidewalls of top portions of the first and second active fins 54 and 59 may be exposed by the first isolation layer 20.

Figure 15:
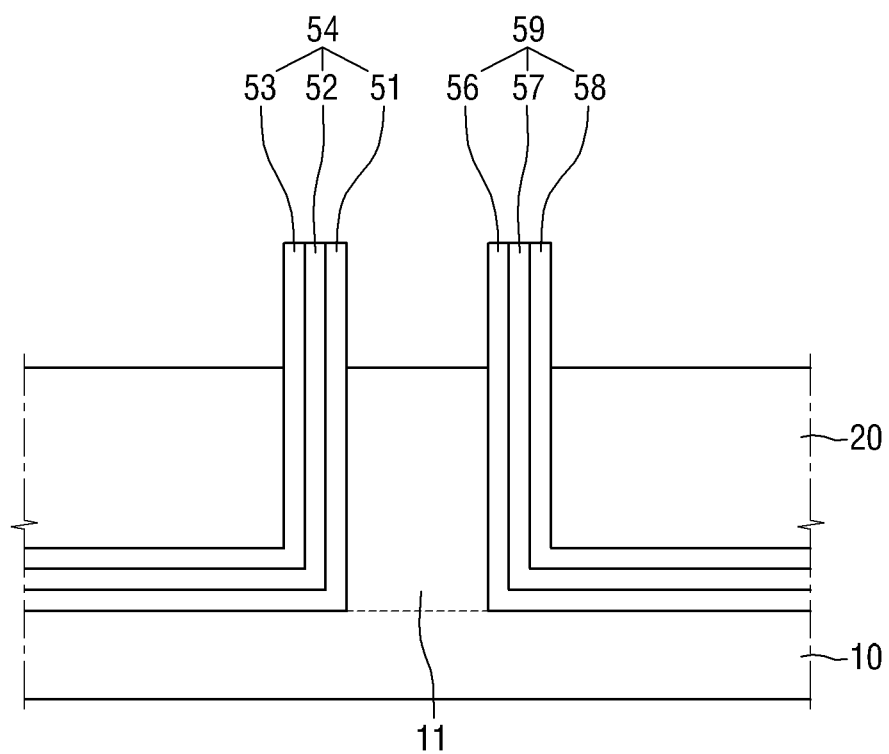

Next, referring to FIG. 15, the fin 11 formed between the first active fin 54 and the second active fin 59 and having an exposed top surface is primarily etched (e.g., etched for a first time and etched more than any adjacent layers are etched).

Here, the top surface of the primarily etched fin 11 may be positioned at the same height as a top surface of the first isolation layer 20.

Figure 16:
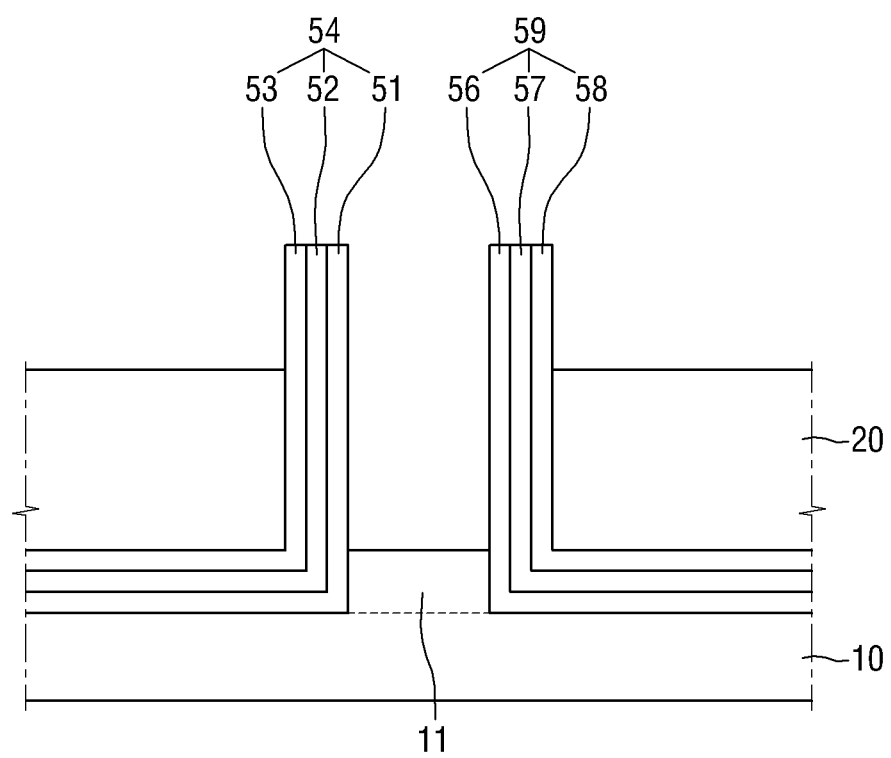

Next, referring to FIG. 16, the fin 11 formed between the first active fin 54 and the second active fin 59 and having an exposed top surface is secondly etched (i.e., etched again/for a second time).

Here, the top surface of the secondly etched fin 11 may be positioned lower than the top surface of the first isolation layer 20. That is to say, a height of the fin 11, as measured from the top surface of the base 10, may be shorter than a height of the first isolation layer 20, as measured from the top surface of the base 10.

In some embodiments of present inventive concepts, the fin 11 may be completely removed. That is to say, when necessary, the fin 11 may be completely removed to expose the top surface of the base 10.

Figure 17:
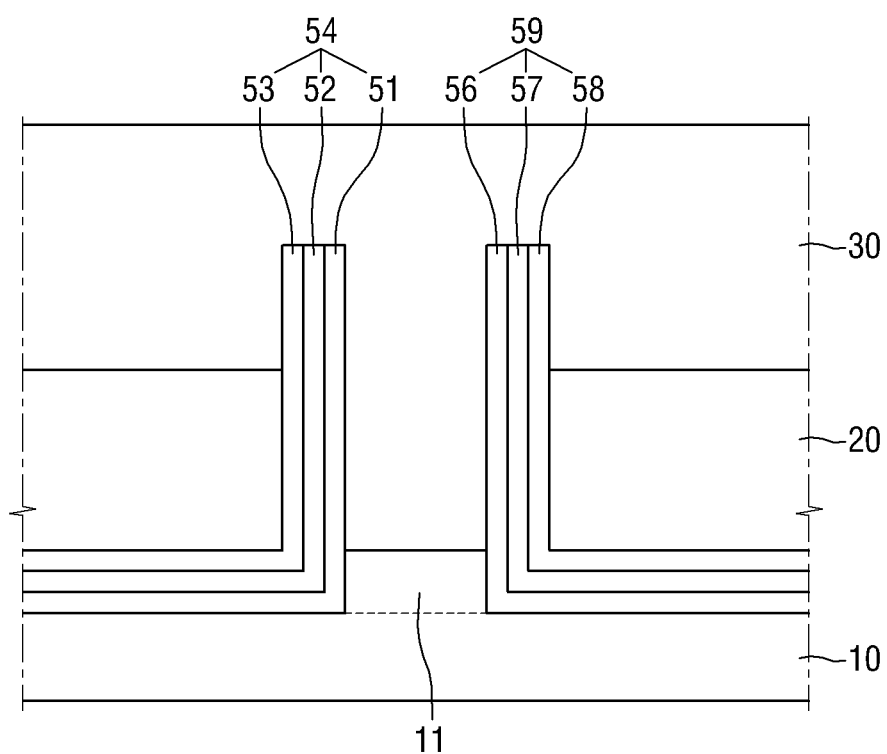

Next, referring to FIG. 17, a second isolation layer 30 is formed on the base 10.

The second isolation layer 30 may completely cover the first and second active fins 54 and 59 and the first isolation layer 20.

In some embodiments of present inventive concepts, the second isolation layer 30 may include a different insulation layer from the first isolation layer 20. For example, when the first isolation layer 20 includes an oxide layer, the second isolation layer 30 may include a nitride layer or an oxynitride layer, but aspects of present inventive concepts are not limited thereto. The first and second isolation layers 20 and 30 may be modified in different/various manners.

Figure 18:
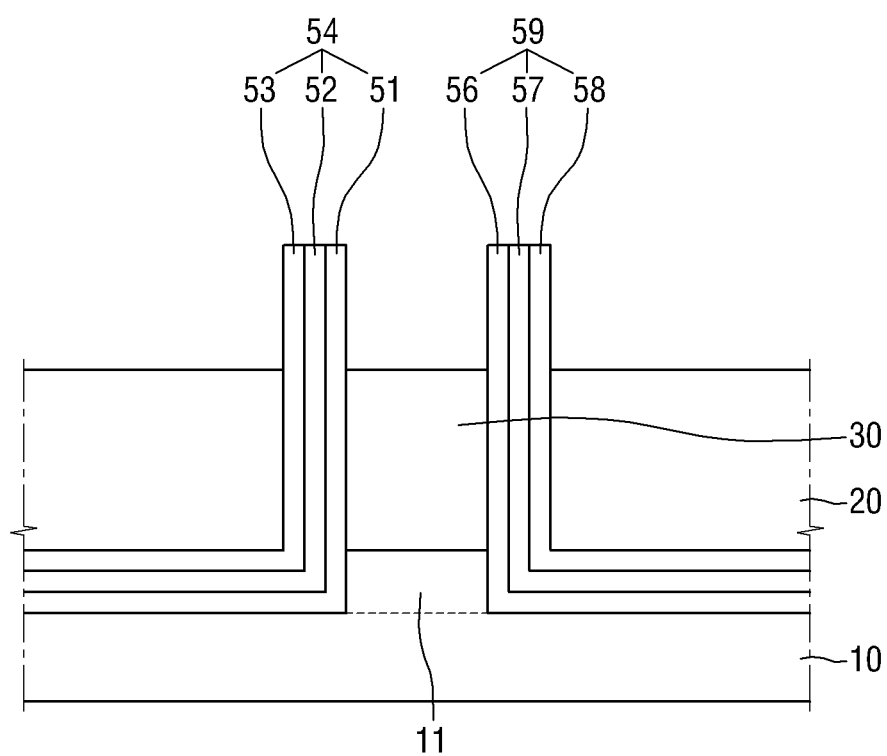

Next, referring to FIG. 18, a portion of the second isolation layer 30 is removed, thereby exposing top portions of the first and second active fins 54 and 59. During the removing of the second isolation layer 30, the first isolation layer 20 may function as an etch stop layer.

After the removing is completed, a height of a top surface of the second isolation layer 30 may be substantially the same as a height of a top surface of the first isolation layer 20, as shown. In addition, as shown, the top surface of the second isolation layer 30 may be lower than top surfaces of the first and second active fins 54 and 59.

The second isolation layer 30 may insulate the first active fin 54 and the second active fin 59 from each other.

Figure 19:
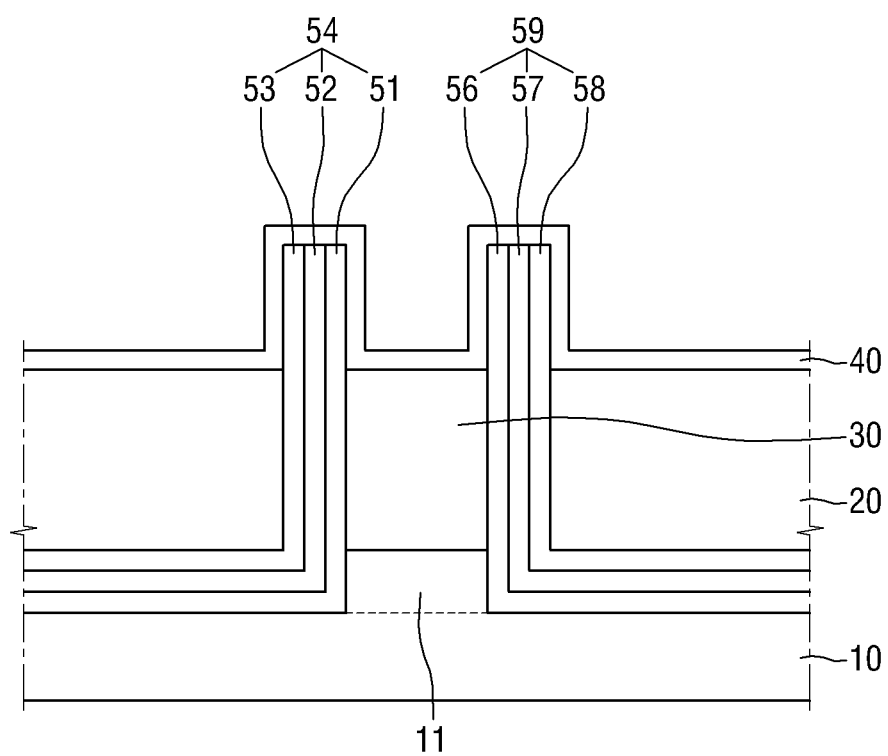

Next, referring to FIG. 19, a gate insulation layer 40 is formed on the first and second isolation layers 20 and 30 and the first and second active fins 54 and 59.

The gate insulation layer 40 may conformally cover the first and second active fins 54 and 59. In detail, the gate insulation layer 40 may cover one lateral surface, a top surface and the other lateral surface of the first active fin 54 and may cover one lateral surface, a top surface and the other lateral surface of the second active fin 59.

Thereafter, a gate electrode (e.g., the gate electrode 60 of FIG. 1) is formed on the gate insulation layer 40. Then, a gate electrode (e.g., the gate electrode 60 of FIG. 1) is patterned and a spacer (e.g., the spacer 80 of FIG. 1) and a semiconductor pattern (e.g., the semiconductor pattern 70 of FIG. 1) are formed at opposite sides of the gate electrode (e.g., the gate electrode 60 of FIG. 1), thereby fabricating the semiconductor device 1 shown in FIGS. 1 to 3.

In some embodiments according to FIGS. 10-19, to improve the performance of the semiconductor device, the first and second active fins 54 and 59 having a quantum well structure are used, and the first active fin 54 and the second active fin 59 separated from each other are formed in a relatively simplified manner. Accordingly, when the first active fin 54 and the second active fin 59 are formed to be separated from each other, the semiconductor device is reduced in size, so that the first and second active fins 54 and 59 can be reliably formed even with a very small pitch.

FIGS. 20 to 26 are diagrams illustrating a method for fabricating a semiconductor device according to some embodiments of present inventive concepts. The following description will focus on differences between FIGS. 20-26 and FIGS. 10-19.

Figure 20:
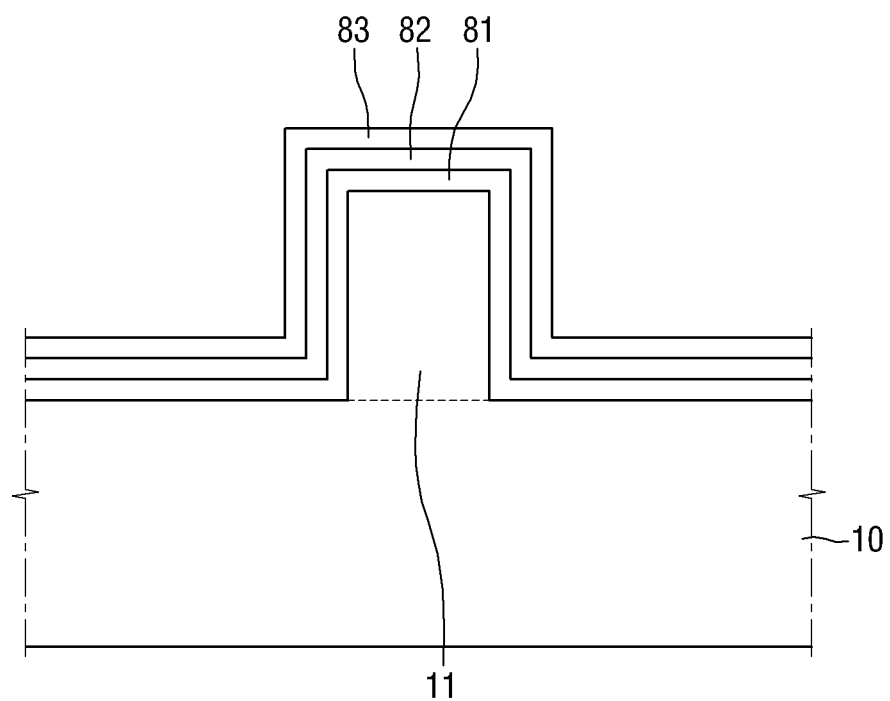
FIGS. 20 to 26 are diagrams illustrating a method for fabricating a semiconductor device according to some embodiments of present inventive concepts.

Referring first to FIG. 20, a fin 11 is formed by etching a base 10 and conformally forming 11th to 13th active layers 81 to 83 on the base 10 and the fin 11.

Figure 21:
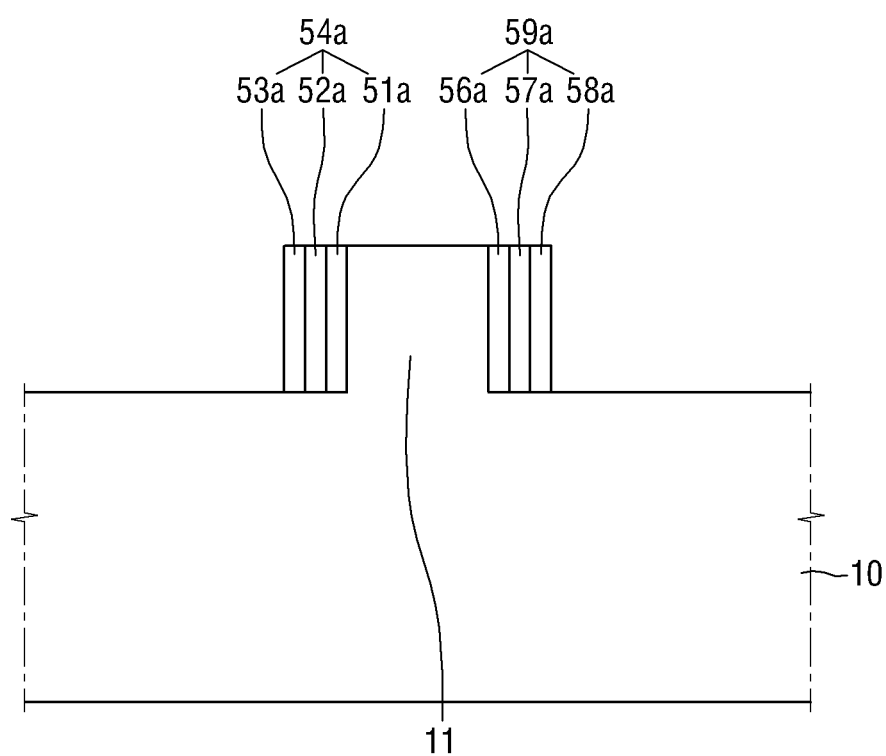

Next, referring to FIG. 21, a top surface of the base 10 may be exposed/etched and the 11th to 13th active layers 81 to 83 formed on the top surface of the fin 11 are etched.

Accordingly, as shown, a first active fin 54a and a second active fin 59a separated from each other by the fin 11 may be formed.

The first active fin 54a may include first to third active fin layers 51a, 52a and 53a that are sequentially stacked, and the second active fin 59a may include fourth to sixth active fin layers 56a, 57a and 58a that are sequentially stacked.

Figure 22:
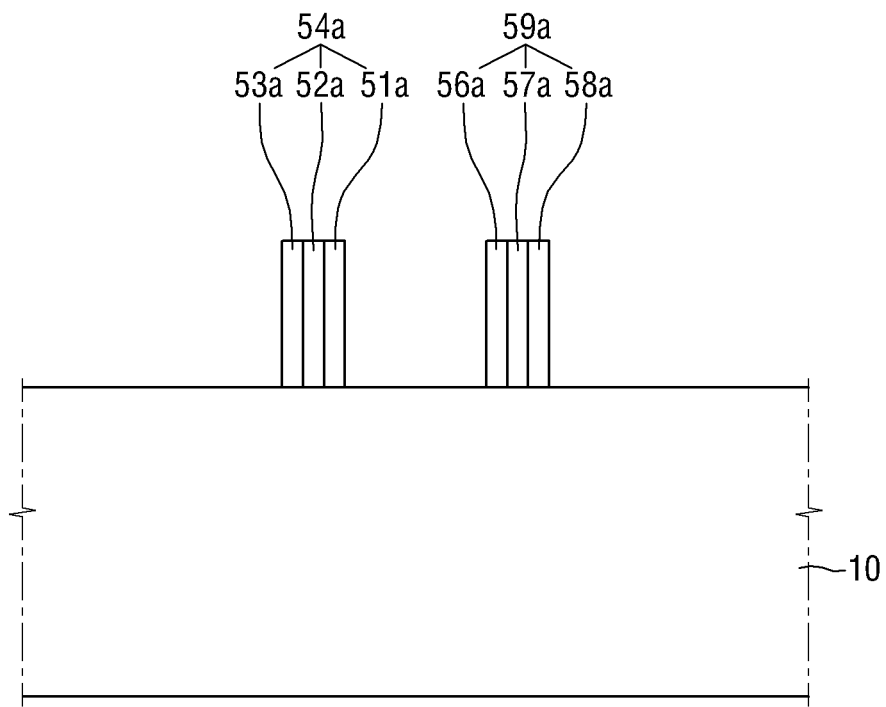

Next, referring to FIG. 22, the fin 11 formed between the first active fin 54a and the second active fin 59a is removed by, for example, an etch back process.

Accordingly, a top surface of the base 10 may be exposed between the first active fin 54a and the second active fin 59a.

Figure 23:
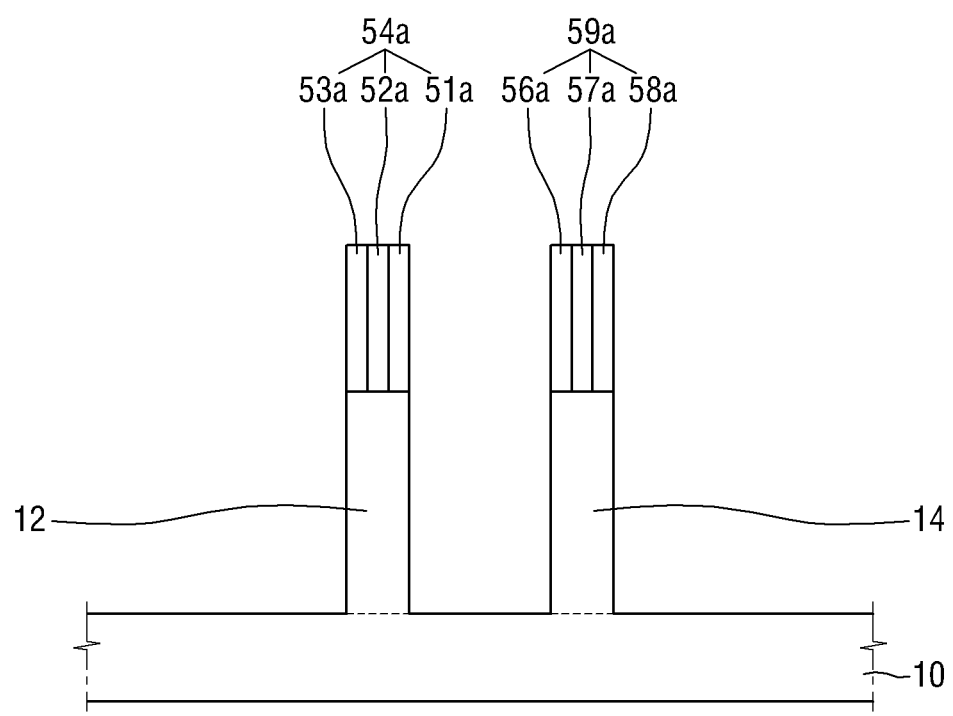

Next, referring to FIG. 23, the base 10 having an exposed top surface is etched.

As a result of the etching, a height of the base 10 is reduced, and a first fin 12 and a second fin 14 upwardly protruding from the top surface of the base 10 may be formed.

As shown, the first fin 12 may be formed at a bottom portion of the first active fin 54a to be aligned with the first active fin 54a. In addition, as shown, the second fin 14 may be formed at a bottom portion of the second active fin 59a to be aligned with the second active fin 59a.

In some embodiments of present inventive concepts, the first and second active fins 54a and 59a and the first and second fins 12 and 14 may include different semiconductors. In detail, for example, the first and second active fins 54a and 59a may include Group compound semiconductors and each of the first and second fins 12 and 14 may include a Group IV semiconductor, but aspects of present inventive concepts are not limited thereto.

Figure 24:
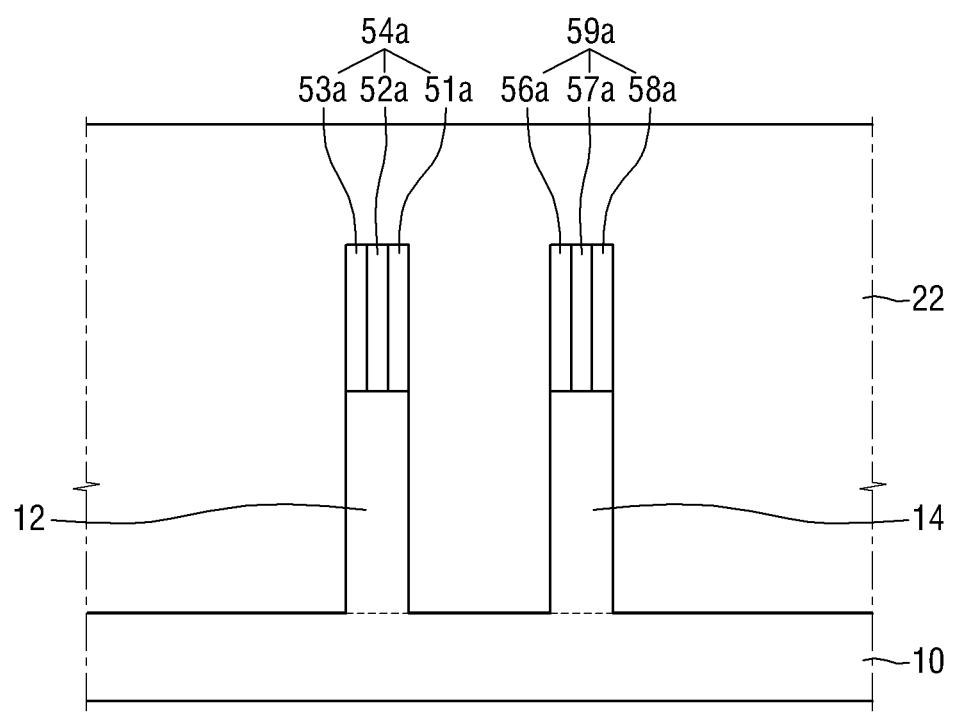

Next, referring to FIG. 24, an isolation layer 22 is formed on the base 10.

As shown, the isolation layer 22 may be formed to cover top surfaces of the first and second active fins 54a and 59a while filling a portion/space between the first and second active fins 54a and 59a.

Figure 25:
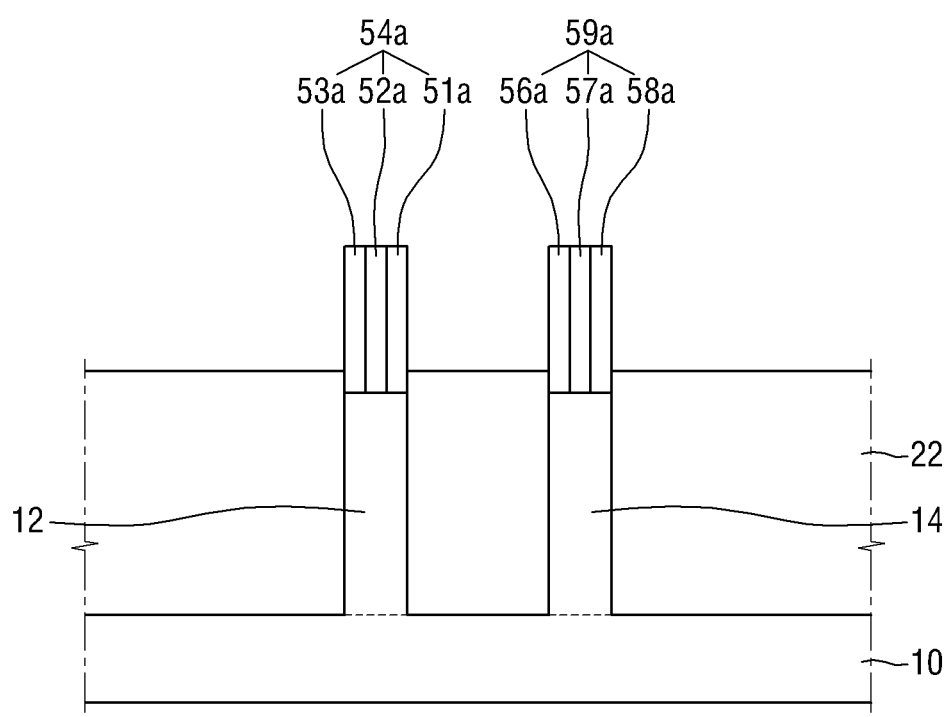

Next, referring to FIG. 25, a top portion of the isolation layer 22 is partially removed.

Accordingly, top portions of the first and second active fins 54a and 59a may be exposed. Here, a top surface of the isolation layer 22 may be higher than bottom surfaces of the first and second active fins 54a and 59a. That is to say, the top surface of the isolation layer 22 may be higher than top surfaces of the first and second fins 12 and 14.

However, present inventive concepts do not limit the shape of the isolation layer 22 to that illustrated herein. Rather, the shape of the isolation layer 22 may vary in various manners.

Figure 26:
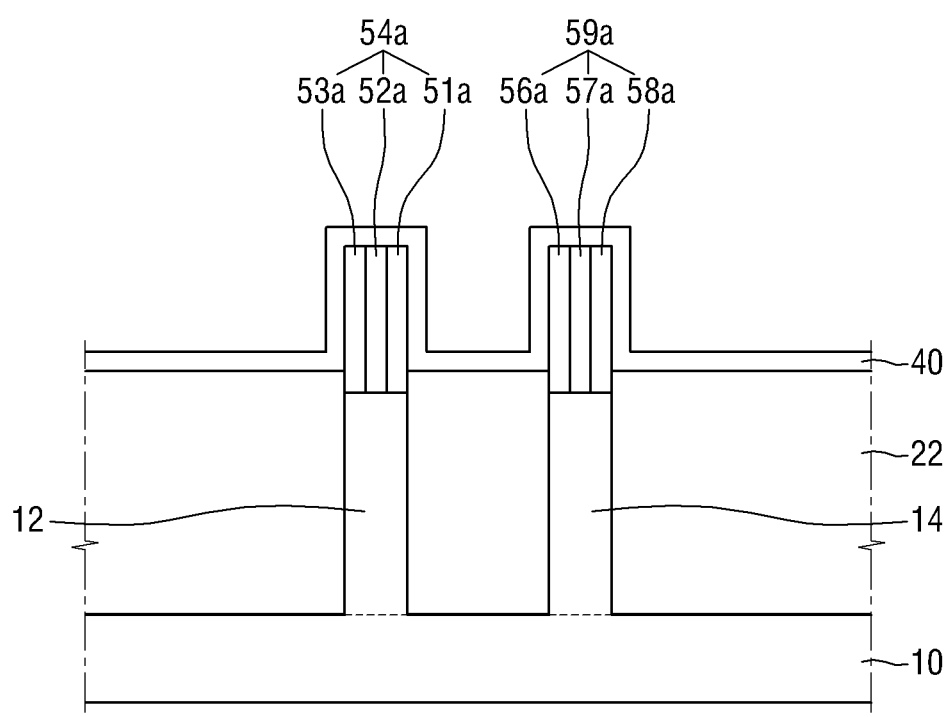

Next, referring to FIG. 26, a gate insulation layer 40 is formed on the isolation layer 22 and the first and second active fins 54a and 59a.

The gate insulation layer 40 may conformally cover the first and second active fins 54a and 59a. In detail, the gate insulation layer 40 may cover one lateral surface, a top surface and the other lateral surface of the first active fin 54a and may cover one lateral surface, a top surface and the other lateral surface of the second active fin 59a.

Thereafter, a gate electrode (e.g., the gate electrode 60 of FIG. 4) is formed on the gate insulation layer 40 and previously-described processes herein regarding the semiconductor pattern 70 and the spacer 80 are then performed, thereby fabricating the semiconductor device 2 shown in FIG. 4.

FIGS. 27 to 36 are diagrams illustrating a method for fabricating a semiconductor device according to some embodiments of present inventive concepts. The following description will focus on differences between FIGS. 27-36 and FIGS. 10-26.

Figure 27:
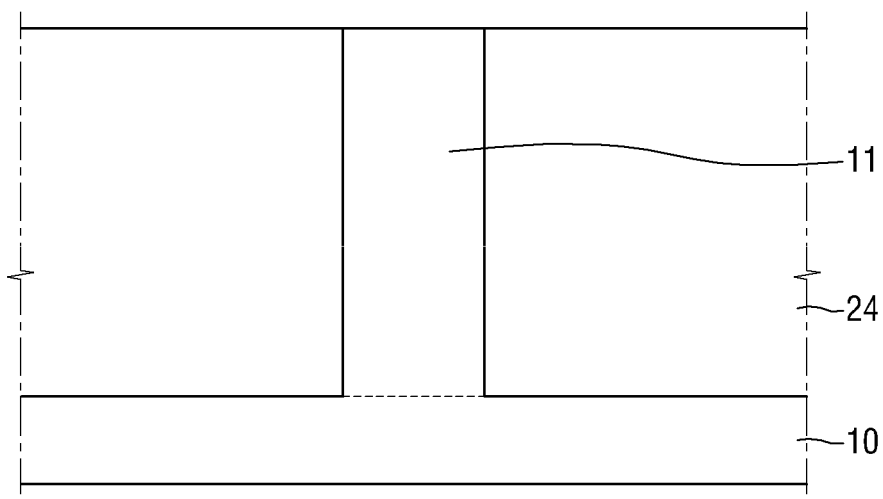
FIGS. 27 to 36 are diagrams illustrating a method for fabricating a semiconductor device according to some embodiments of present inventive concepts.

First, referring to FIG. 27, a fin 11 is formed by etching a base 10 and a first isolation layer 24 is formed on the base 10.

Figure 28:
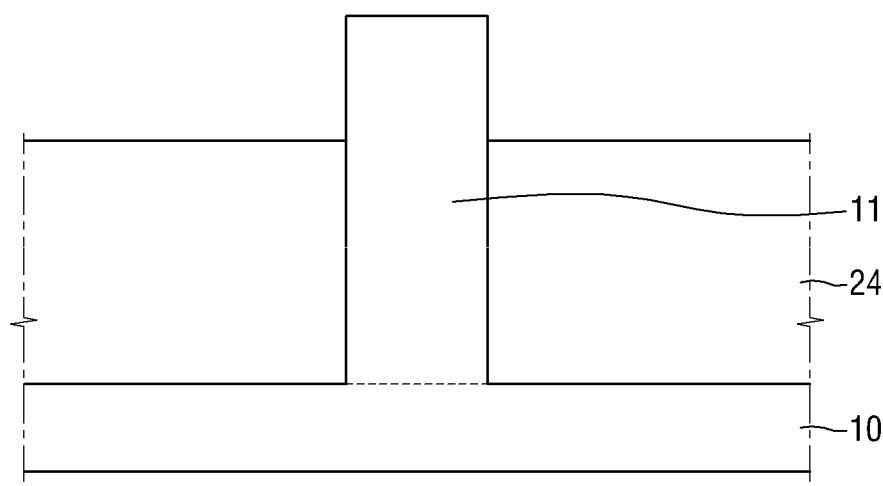

Next, referring to FIG. 28, the top portion of the first isolation layer 24 is partially removed/etched to expose lateral surfaces of the fin 11.

As a result of etching of the first isolation layer 24, an exterior surface of the top portion of the fin 11 may be exposed.

Figure 29:
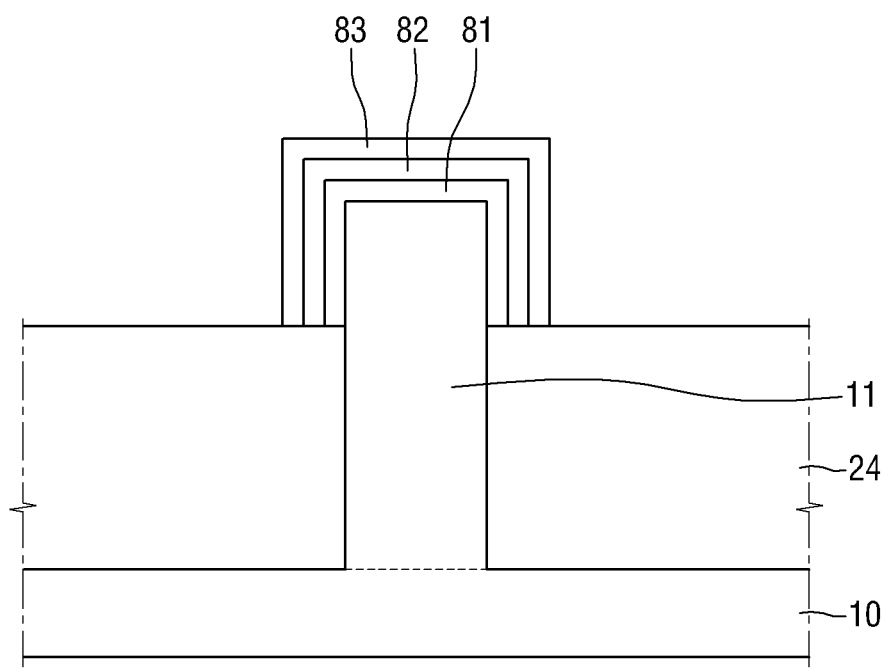

Next, referring to FIGS. 29, 11th to 13th active layers 81 to 83 are conformally formed on one lateral surface, a top surface and the other lateral surface of the exposed fin 11.

In some embodiments of present inventive concepts, the 11th to 13th active layers 81 to 83 may be formed by, for example, an epitaxial growth process. In this case, the 11th to 13th active layers 81 to 83 may not be formed on the first isolation layer 24.

Figure 30:
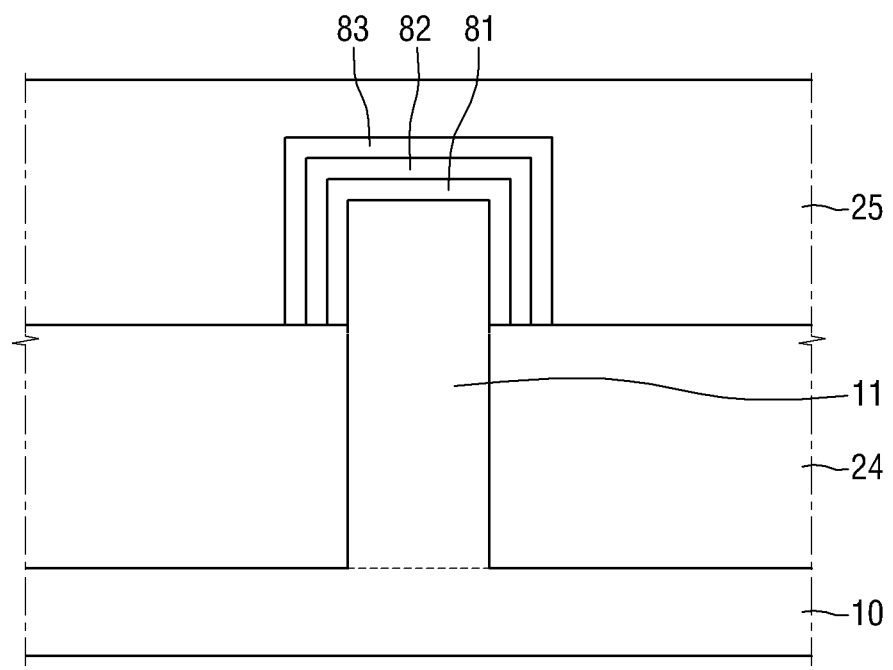

Next, referring to FIG. 30, a third isolation layer 25 covering the 11th to 13th active layers 81 to 83 is formed.

The third isolation layer 25 may be formed to cover the entire surface of the 13th active layer 83 and a top surface of the first isolation layer 24, as shown.

In some embodiments of present inventive concepts, the third isolation layer 25 may include a different insulation layer from the first isolation layer 24, but aspects of present inventive concepts are not limited thereto.

Figure 31:
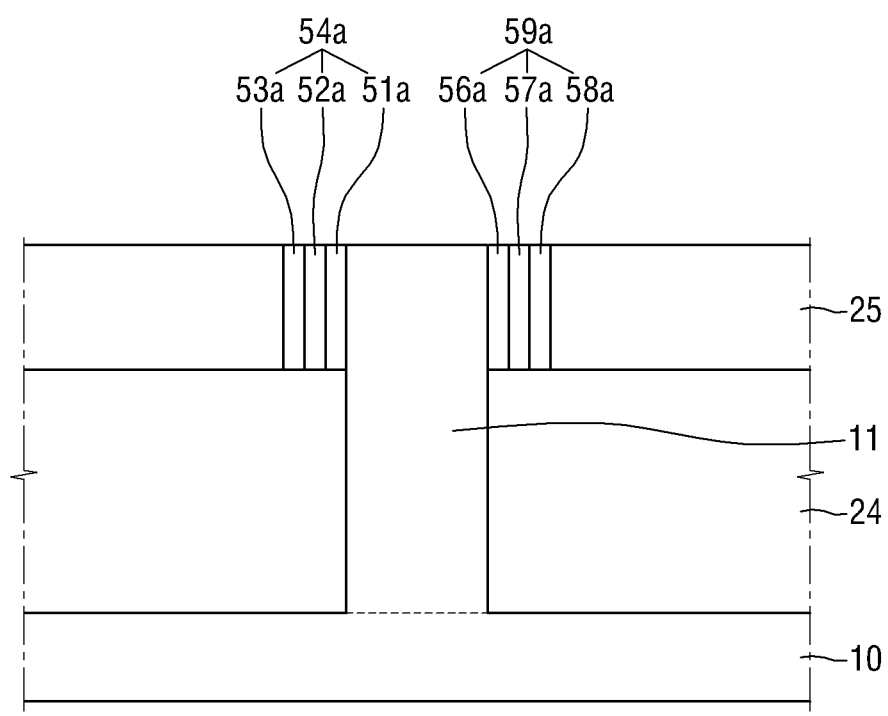

Next, referring to FIG. 31, portions of the third isolation layer 25 and the 11th to 13th active layers 81 to 83, formed on the fin 11, are removed.

Accordingly, a first active fin 54a and a second active fin 59a may be formed at opposite sides of the fin 11, respectively.

The first active fin 54a may include first to third active fin layers 51a, 52a and 53a sequentially stacked and the second active fin 59a may include fourth to sixth active fin layers 56a, 57a and 58a sequentially stacked.

Figure 32:
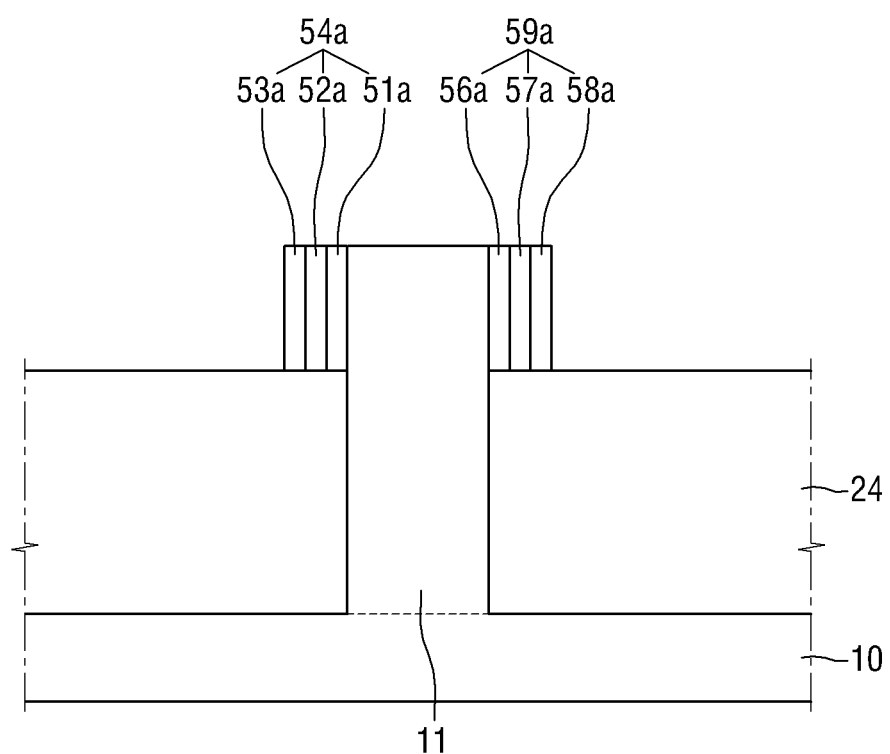

Next, referring to FIG. 32, the third isolation layer (e.g., the third isolation layer 25 of FIG. 31) formed on the first isolation layer 24 is removed.

The removing may be performed using, for example, an etching selectivity between the first isolation layer 24 and the third isolation layer (e.g., the third isolation layer 25 of FIG. 31).

Figure 33:
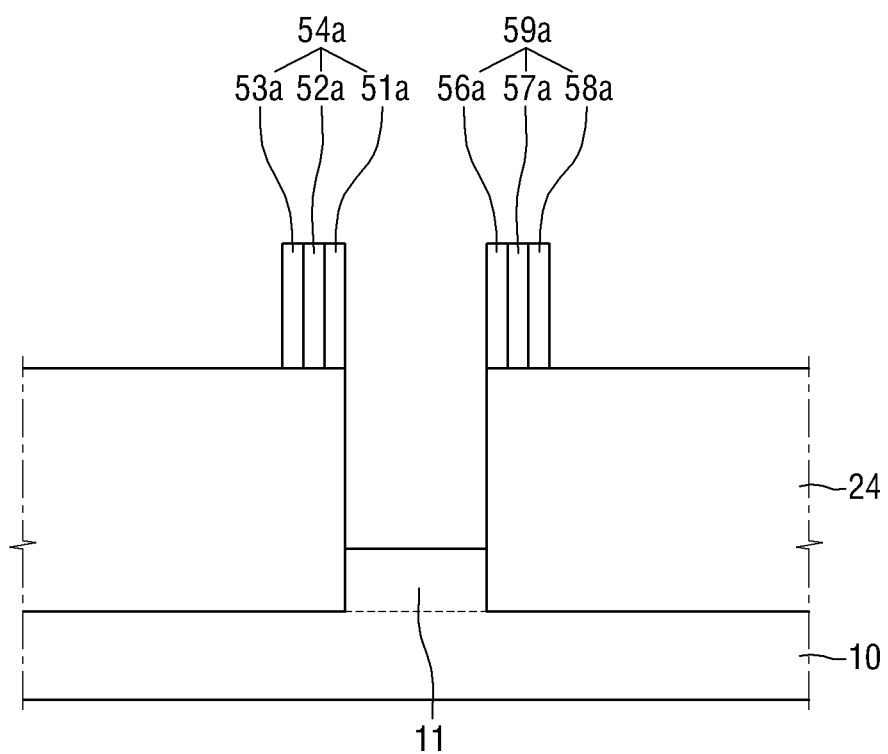

Next, referring to FIG. 33, at least a portion of the fin 11 formed between the first active fin 54a and the second active fin 59a is removed by, for example, an etch back process.

As shown, a top surface of the exposed fin 11 may be lower than a top surface of the first isolation layer 24. That is to say, a height of the fin 11, as measured from the top surface of the base 10, may be smaller than a height of the first isolation layer 24, as measured from the top surface of the base 10.

In some embodiments of present inventive concepts, the fin 11 may be completely removed. That is to say, when necessary, the fin 11 may be completely removed to expose the top surface of the base 10.

Figure 34:
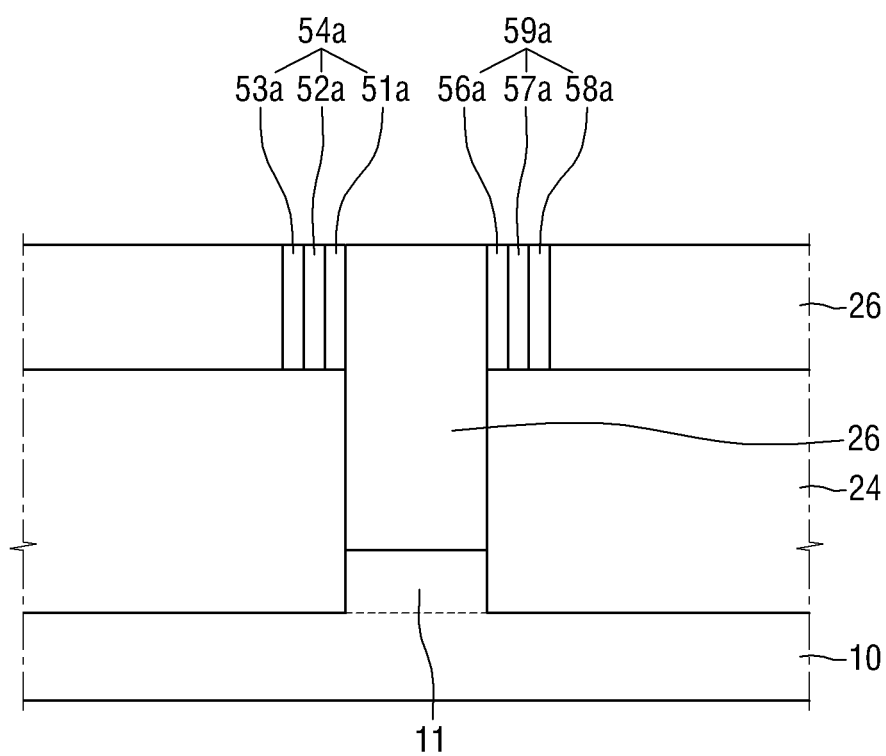

Next, referring to FIG. 34, a second isolation layer 26 is formed on the base 10.

The second isolation layer 26 may completely cover the first and second active fins 54a and 59a and the first isolation layer 24.

In some embodiments of present inventive concepts, the second isolation layer 26 may include a different insulation layer from the first isolation layer 24. For example, when the first isolation layer 24 includes an oxide layer, the second isolation layer 26 may include a nitride layer or an oxynitride layer, but aspects of present inventive concepts are not limited thereto. The first and second isolation layers 24 and 26 may be modified in different/various manners.

Figure 35:
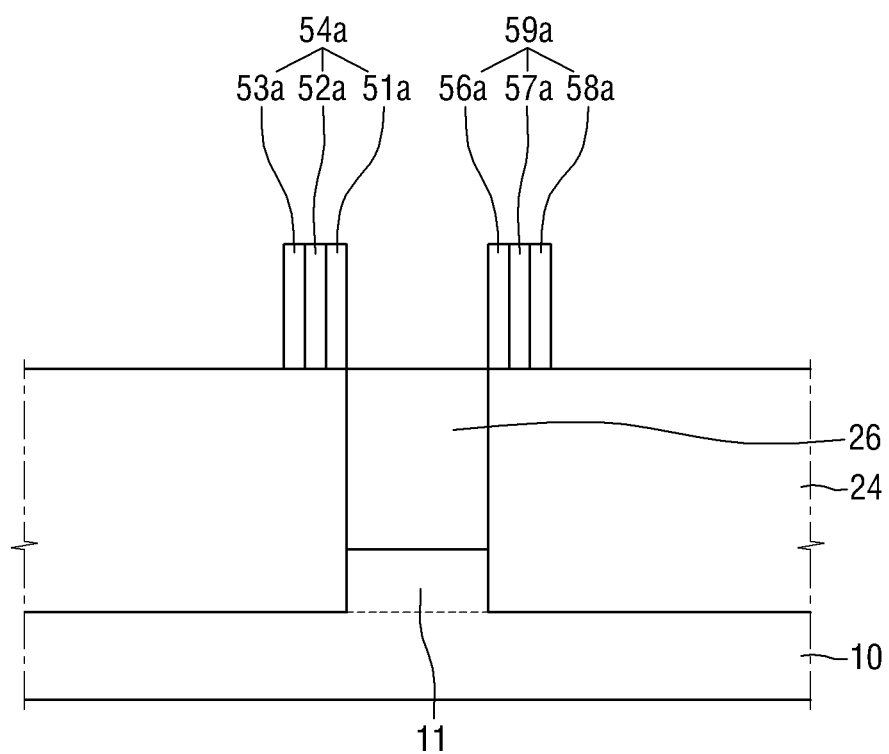

Next, referring to FIG. 35, a portion of the second isolation layer 26 is removed, thereby exposing top portions of the first and second active fins 54a and 59a.

As shown, one lateral surface, a top surface and the other lateral surface of the first active fin 54a and one lateral surface, a top surface and the other lateral surface of the second active fin 59a may be exposed. The remaining top surface of the second isolation layer 26 may be substantially coplanarly positioned with bottom surfaces of the first and second active fins 54a and 59a and a top surface of the first isolation layer 24.

However, present inventive concepts do not limit the height of the second isolation layer 26 to that illustrated herein. Rather, the height of the second isolation layer 26 may vary in various manners.

The second isolation layer 26 may insulate the first active fin 54a and the second active fin 59a from each other.

During the removing of the second isolation layer 26, the first isolation layer 24 may function as an etch stop layer.

Figure 36:
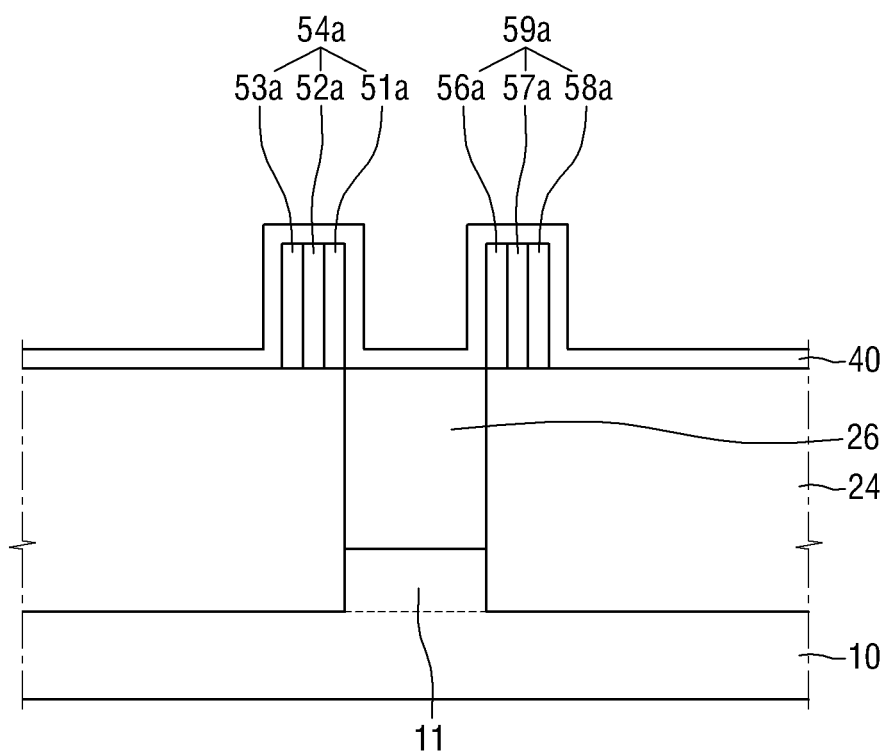

Next, referring to FIG. 36, a gate insulation layer 40 is formed on the first and second isolation layers 24 and 26 and the first and second active fins 54a and 59a.

The gate insulation layer 40 may conformally cover the first and second active fins 54a and 59a. In detail, the gate insulation layer 40 may cover one lateral surface, a top surface and the other lateral surface of the first active fin 54a and may cover one lateral surface, a top surface and the other lateral surface of the second active fin 59a.

Thereafter, a gate electrode (e.g., the gate electrode 60 of FIG. 5) is formed on the gate insulation layer 40 and previously-described processes herein regarding the semiconductor pattern 70 and the spacer 80 are then performed, thereby fabricating the semiconductor device 3 shown in FIG. 5.

FIGS. 37 to 44 are diagrams illustrating a method for fabricating a semiconductor device according to some embodiments of present inventive concepts. The following description will focus on differences between FIGS. 37-44 and FIGS. 10-36.

Figure 37:
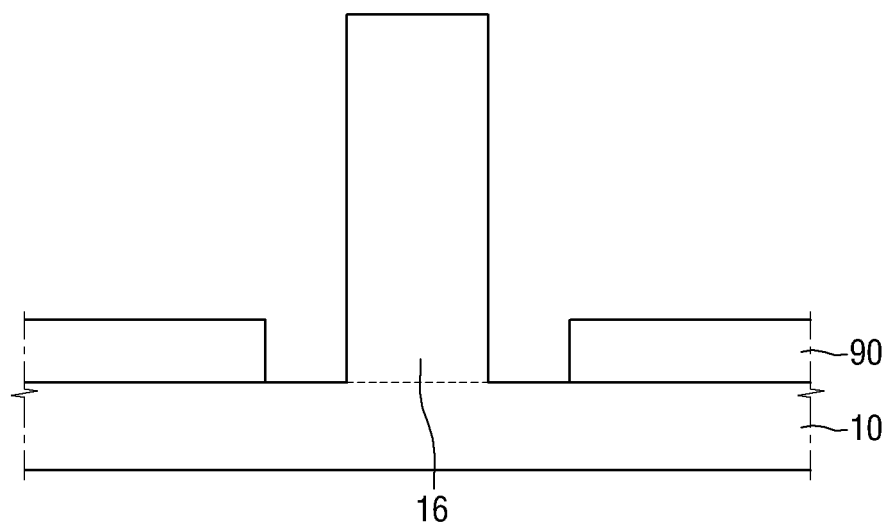
FIGS. 37 to 44 are diagrams illustrating a method for fabricating a semiconductor device according to some embodiments of present inventive concepts.

First, referring to FIG. 37, a fin 16 is formed by etching a base 10. Next, a sacrificial layer pattern 90 is formed on the base 10.

In some embodiments of present inventive concepts, the sacrificial layer pattern 90 may include, for example, a photo resist pattern, but aspects of present inventive concepts are not limited thereto.

As shown, the sacrificial layer pattern 90 may be spaced a predetermined distance apart from the fin 16.

Figure 38:
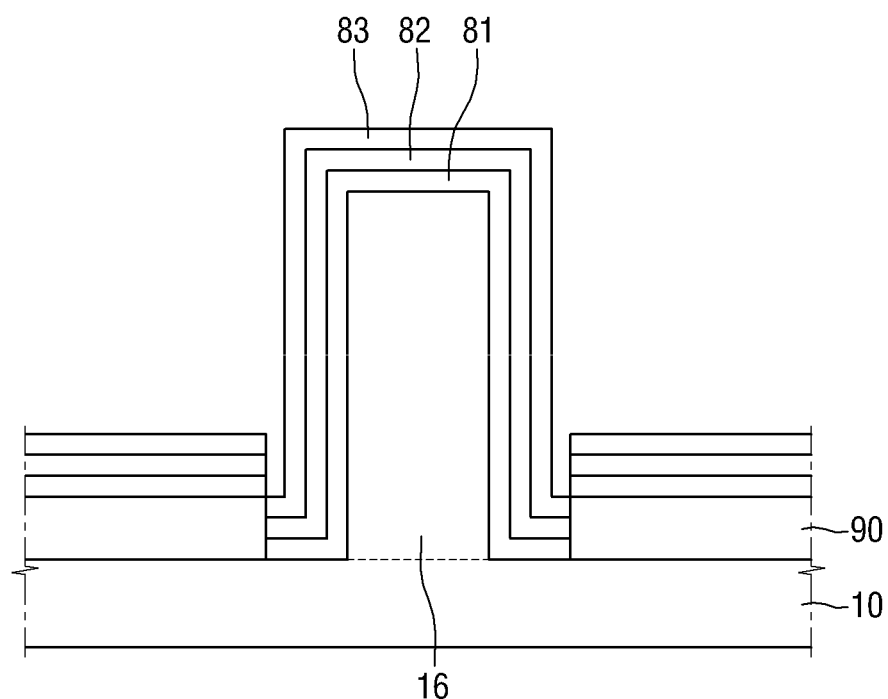

Next, referring to FIGS. 38, 11th to 13th active layers 81 to 83 are formed on the base 10.

As shown, the 11th to 13th active layers 81 to 83 may conformally cover the fin 16 and may be formed on the sacrificial layer pattern 90 as well. In addition, as shown, the 11th to 13th active layers 81 to 83 may extend from lateral surfaces of the fin 16 to the sacrificial layer pattern 90. In other words, the 11th to 13th active layers 81 to 83 may fill a space between the fin 16 and the sacrificial layer pattern 90.

Figure 39:
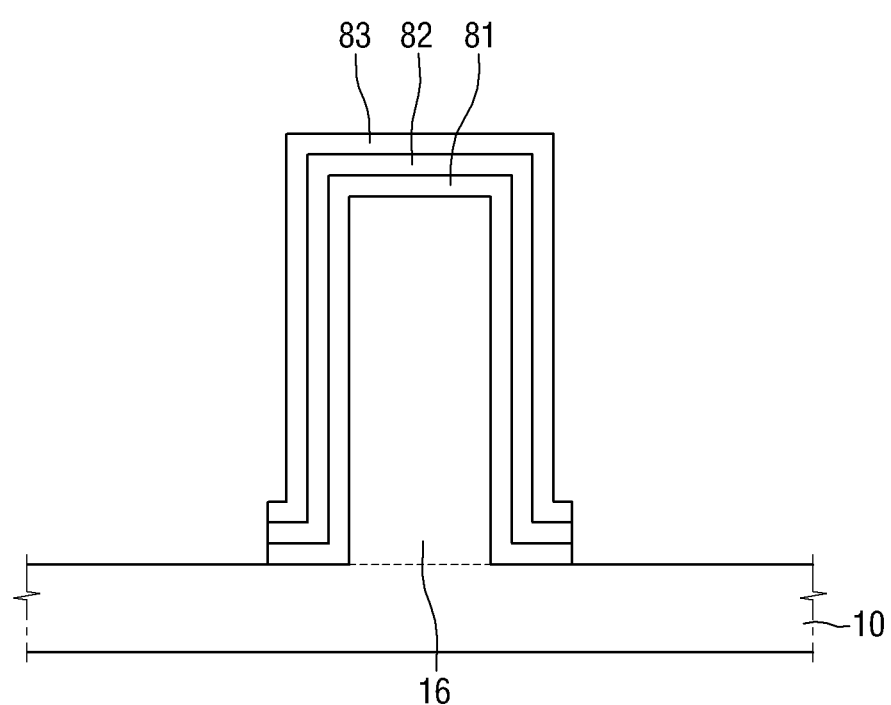

Next, referring to FIG. 39, the sacrificial layer pattern (e.g., the sacrificial layer pattern 90 of FIG. 38) is removed.

Accordingly, the 11th to 13th active layers 81 to 83 formed on the sacrificial layer pattern (e.g., the sacrificial layer pattern 90 of FIG. 38) may also be removed at this stage.

Figure 40:
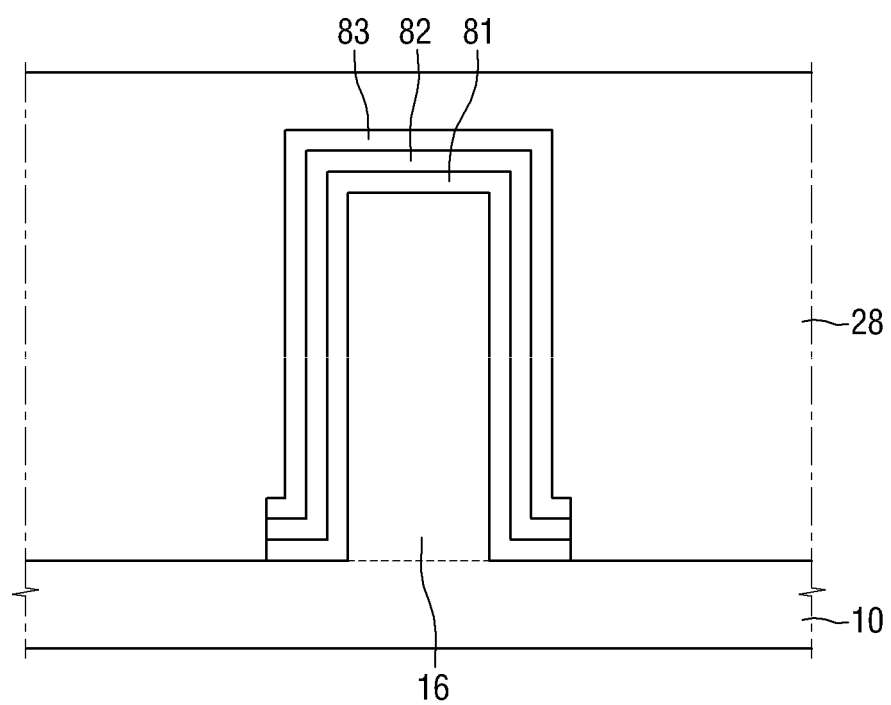

Next, referring to FIG. 40, an isolation layer 28 (e.g., as illustrated in FIG. 6) is formed on the base 10.

As shown, the isolation layer 28 may be formed to completely cover the 11th to 13th active layers 81 to 83 and a top surface of the base 10.

Figure 41:
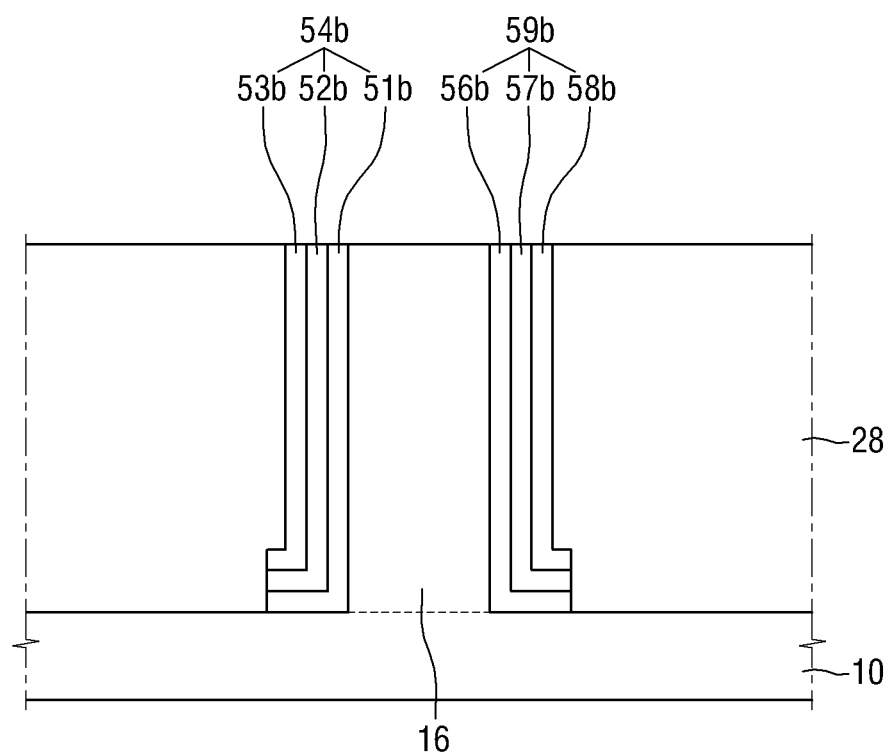

Next, referring to FIG. 41, portions of the isolation layer 28 and the 11th to 13th active layers 81 to 83 that are formed on the fin 16 are removed.

Accordingly, a first active fin 54*b* and a second active fin 59*b* may be formed at opposite sides of the fin 16, respectively.

As shown, the first active fin 54*b* may have a bent/curved bottom portion and the second active fin 59*b* may also have a bent/curved bottom portion.

The first active fin 54*b* may include first to third active fin layers 51*b*, 52*b* and 53*b* that are sequentially stacked, and the second active fin 59*b* may include fourth to sixth active fin layers 56*b*, 57*b* and 58*b* that are sequentially stacked.

Figure 42:
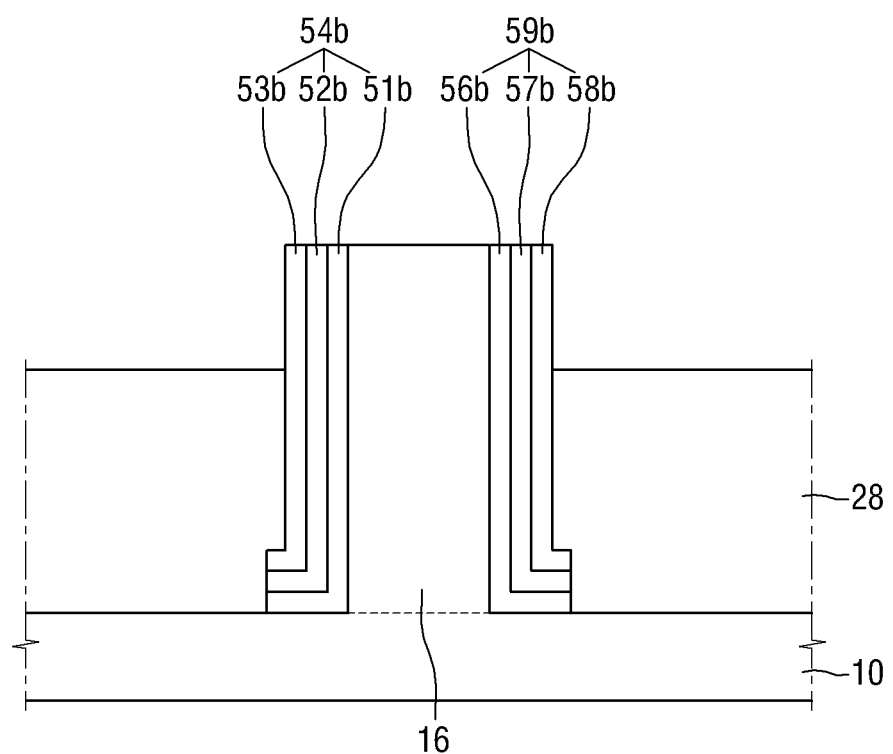

Next, referring to FIG. 42, a top portion of the isolation layer 28 is partially removed to expose top portions of the first and second active fins 54*b* and 59*b*.

Figure 43:
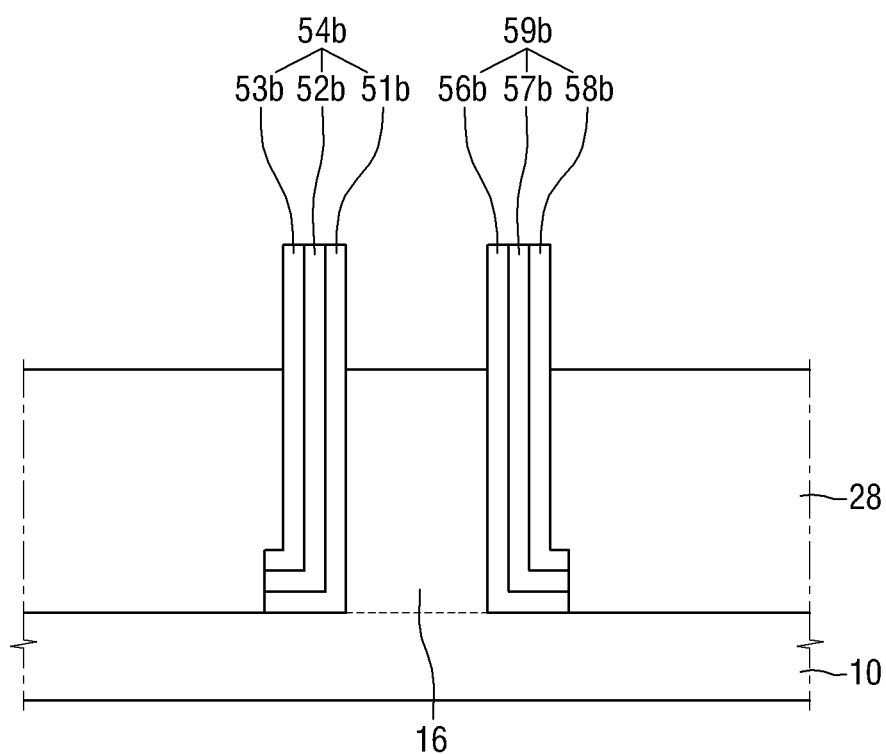

Next, referring to FIG. 43, at least a portion of the fin 16 formed between the first active fin 54*b* and the second active fin 59*b* may be removed by, for example, an etch back process.

As shown, a top surface of the etched fin 16 may be positioned at the same height as a top surface of the isolation layer 28.

Figure 44:
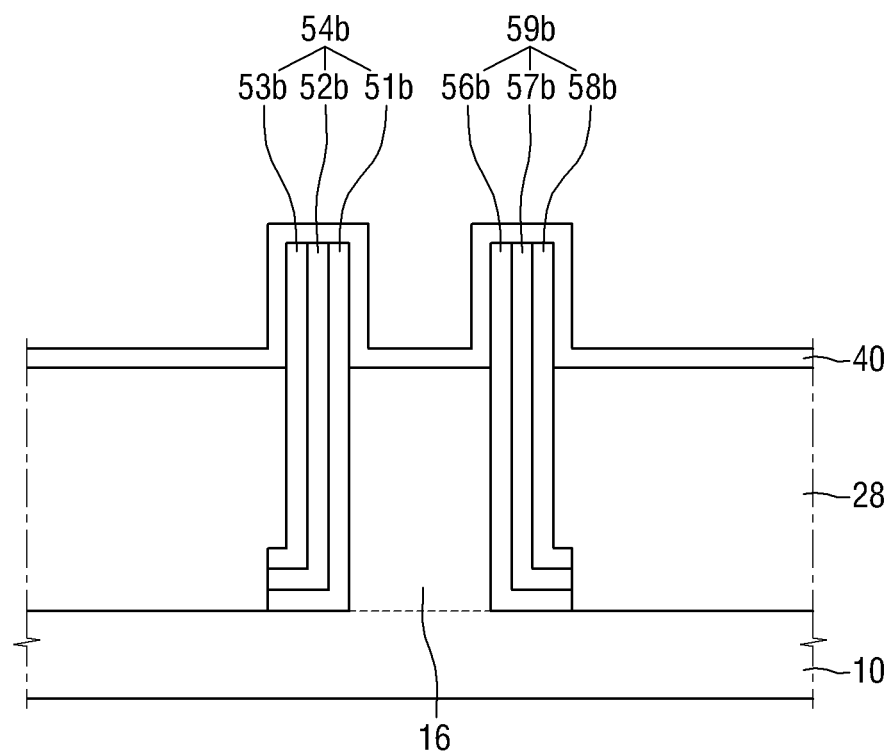

Next, referring to FIG. 44, a gate insulation layer 40 is formed on the isolation layer 28 and the first and second active fins 54*b* and 59*b*.

The gate insulation layer 40 may conformally cover the first and second active fins 54*b* and 59*b*. In detail, the gate insulation layer 40 may cover one lateral surface, a top surface and the other lateral surface of the first active fin 54*b* and may cover one lateral surface, a top surface and the other lateral surface of the second active fin 59*b*.

Thereafter, a gate electrode (e.g., the gate electrode 60 of FIG. 6) is formed on the gate insulation layer 40 and previously-described processes herein regarding the semiconductor pattern 70 and the spacer 80 are then performed, thereby fabricating the semiconductor device 4 shown in FIG. 6.

Figure 45:
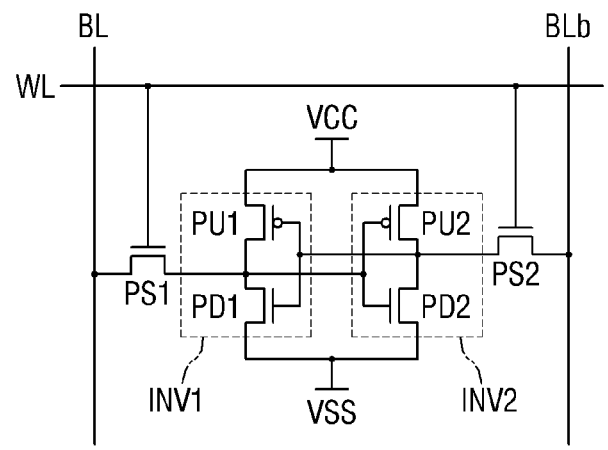
FIG. 45 is a circuit view for explaining a memory device including semiconductor devices according to some embodiments of present inventive concepts.
Figure 46:
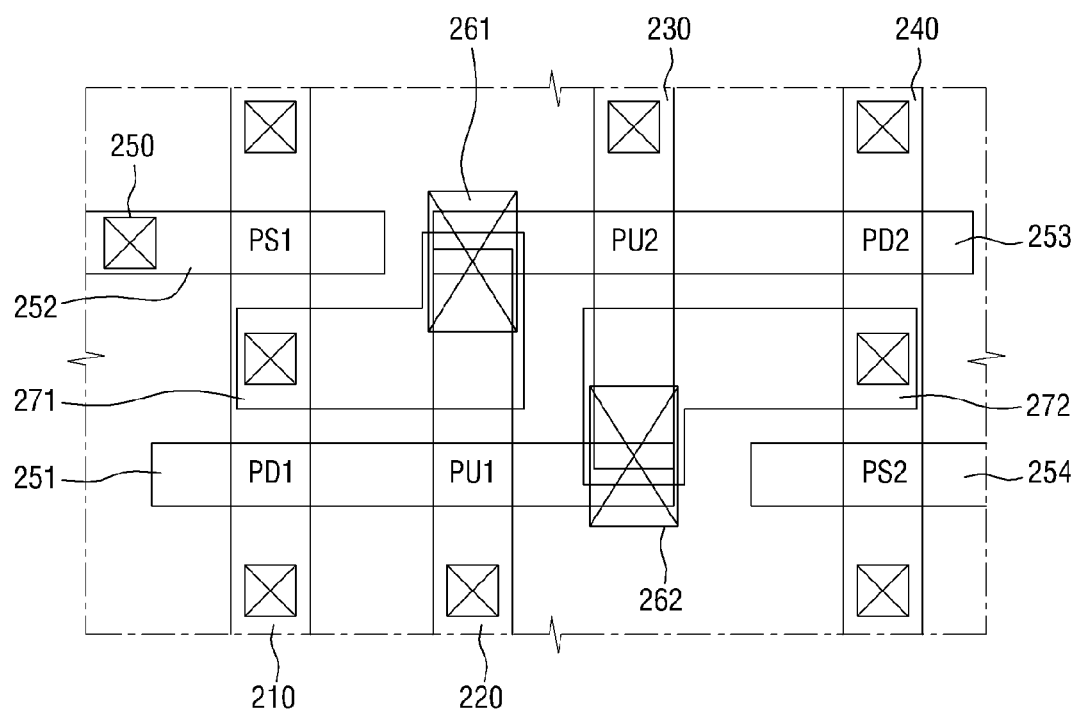
FIG. 46 is a layout view of the memory device shown in FIG. 45.

FIG. 45 is a circuit view for explaining a memory device including semiconductor devices according to some embodiments of present inventive concepts, and FIG. 46 is a layout view of the memory device shown in FIG. 45.

Referring to FIG. 45, the memory device may include a pair of inverters INV1 and INV2 connected in parallel between a power supply node Vcc and a ground node Vss, and a first pass transistor PS1 and a second pass transistor PS2 connected to output nodes of the inverters INV1 and INV2.

The first pass transistor PS1 and the second pass transistor PS2 may be connected to a bit line BL and a complementary bit line BLb, respectively. Gates of the first pass transistor PS1 and the second pass transistor PS2 may be connected to a word line WL.

The first inverter INV1 includes a first pull-up transistor PU1 and a first pull-down transistor PD1 connected in series to each other, and the second inverter INV2 includes a second pull-up transistor PU2 and a second pull-down transistor PD2 connected in series to each other.

The first pull-up transistor PU1 and the second pull-up transistor PU2 may be PMOS transistors, and the first pull-down transistor PD 1 and the second pull-down transistor PD2 may be NMOS transistors.

In addition, to constitute a latch circuit, an input node of the first inverter INV1 may be connected to an output node of the second inverter INV2 and an input node of the second inverter INV2 may be connected to an output node of the first inverter INV1.

Referring to FIGS. 45 and 46, a first active fin 210, a second active fin 220, a third active fin 230 and a fourth active fin 240, which are spaced apart from one another, may extend lengthwise in one direction (e.g., in an up-down direction). The second active fin 220 and the third active fin 230 may extend in smaller lengths than the first active fin 210 and the fourth active fin 240.

In addition, a first gate electrode 251, a second gate electrode 252, a third gate electrode 253, and a fourth gate electrode 254 are formed to extend in the other direction (e.g., in a left-right direction) to intersect the first through fourth active fins 210-240.

In detail, the first gate electrode 251 completely intersects the first active fin 210 and the second active fin 220 while partially overlapping a terminal of the third active fin 230. The third gate electrode 253 completely intersects the fourth active fin 240 and the third active fin 230 while partially overlapping a terminal of the second active fin 220. The second gate electrode 252 and the fourth gate electrode 254 are formed to intersect the first active fin 210 and the fourth active fin 240, respectively.

As shown, the first pull-up transistor PU1 is defined in vicinity of an intersection of the first gate electrode 251 and the second active fin 220, the first pull-down transistor PD1 is defined in vicinity of an intersection of the first gate electrode 251 and the first active fin 210, and the first pass transistor PS1 is defined in vicinity of an intersection of the second gate electrode 252 and the first active fin 210.

The second pull-up transistor PU2 is defined in vicinity of an intersection of the third gate electrode 253 and the third active fin 230, the second pull-down transistor PD2 is defined in vicinity of an intersection of the third gate electrode 253 and the fourth active fin 240, and the second pass transistor PS2 is defined in vicinity of an intersection of the fourth gate electrode 254 and the fourth active fin 240.

Sources/drains may be formed at opposite sides of the respective intersections of the first to fourth gate electrodes 251-254 and the first to fourth active fins 210, 220, 230 and 240. In addition, a plurality of contacts 250 may be formed.

Further, a first shared contact 261 may simultaneously connect the second active fin 220, the third gate electrode 253, and a wiring 271 with one another. A second shared contact 262 may simultaneously connect the third active fin 230, the first gate electrode 251 and a wiring 272 with one another.

The first pull-up transistor PU1, the first pull-down transistor PD1, the first pass transistor PS1, the second pull-up transistor PU2, the second pull-down transistor PD2, and the second pass transistor PS2 may all be fin type transistors and may include the semiconductor devices according to some embodiments of present inventive concepts.

Figure 47:
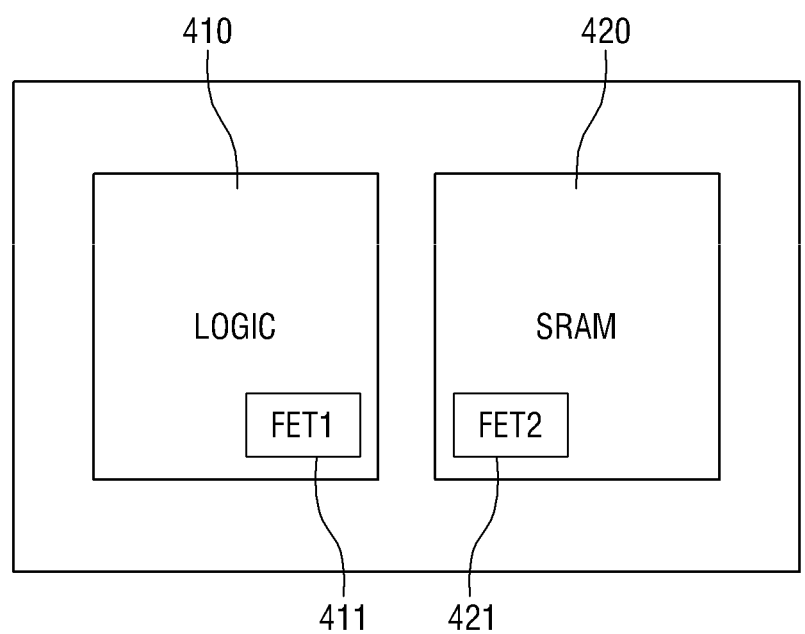
FIG. 47 is a diagram illustrating an example logic device including semiconductor devices according to some embodiments of present inventive concepts.
Figure 48:
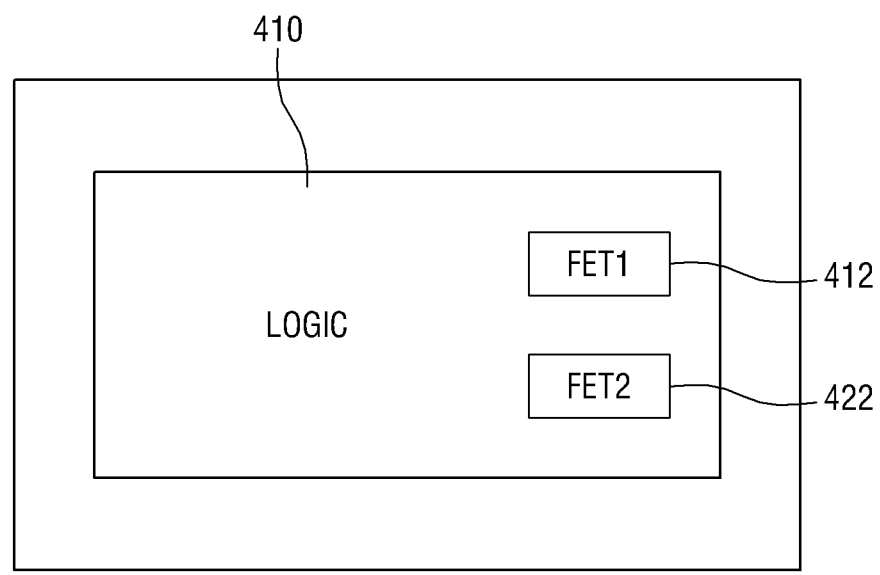
FIG. 48 is a diagram illustrating an example logic device including semiconductor devices according to some embodiments of present inventive concepts.

FIG. 47 is a diagram illustrating an example logic device including semiconductor devices according to some embodiments of present inventive concepts, and FIG. 48 is a diagram illustrating an example logic device including semiconductor devices according to some embodiments of present inventive concepts.

Referring first to FIG. 47, a semiconductor device 13 may include a logic region 410 and an SRAM forming region 420. An 11th transistor 411 may be disposed in the logic region 410 and a 12th transistor 421 may be disposed in the SRAM forming region 420.

In some embodiments of present inventive concepts, the 11th transistor 411 and the 12th transistor 421 may include at least one of the semiconductor devices according to some embodiments of present inventive concepts.

Next, referring to FIG. 48, a semiconductor device 14 may include a logic region 410, and 13th and 14th transistors 412 and 422, which are different from each other, may be formed in the logic region 410. Meanwhile, the 13th and 14th transistors 412 and 422 may be formed in the SRAM forming region 420 as well.

In some embodiments of present inventive concepts, the 13th and 14th transistors 412 and 422 may be different from each other. The 13th and 14th transistors 412 and 422 may include at least one of the semiconductor devices according to some embodiments of present inventive concepts.

In FIG. 47, the logic region 410 and the SRAM forming region 420 are illustrated, but aspects of present inventive concepts are not limited thereto. For example, some embodiments of present inventive concepts may also be applied to the logic region 410 and a region where other types of memories are formed (e.g., Dynamic Random Access Memory (DRAM), Magnetoresistive Random Access Memory (MRAM), Resistive Random Access Memory (RRAM), Phase-change Random Access Memory (PRAM), etc.).

Figure 49:
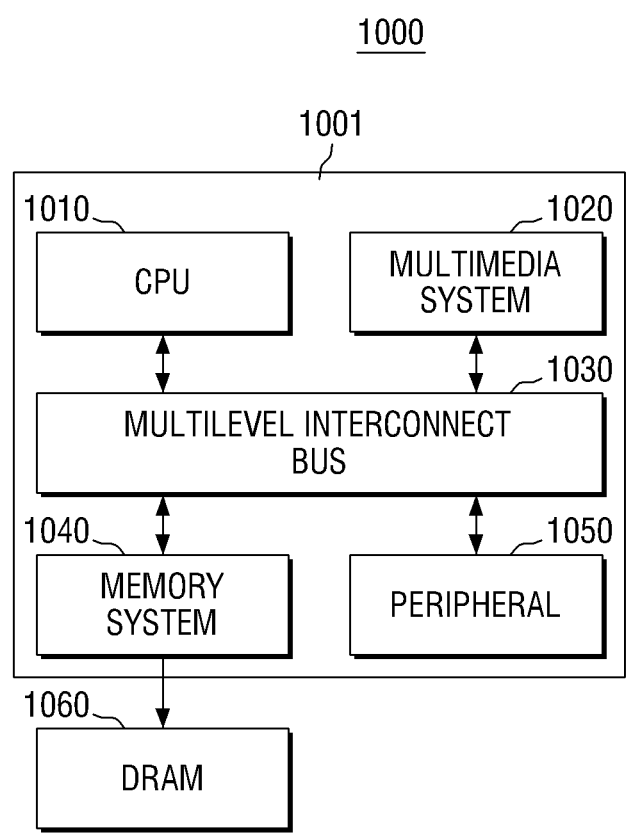
FIG. 49 is a block diagram of an SoC system including semiconductor devices according to some embodiments of present inventive concepts.

FIG. 49 is a block diagram of a System on Chip (SoC) system including semiconductor devices according to some embodiments of present inventive concepts.

Referring to FIG. 49, the SoC system 1000 may include an Application Processor (AP) 1001 and a DRAM 1060.

The application processor 1001 may include a Central Processing Unit (CPU) 1010, a multimedia system 1020, a bus 1030, a memory system 1040, and a peripheral circuit 1050.

The central processing unit 1010 may perform operations necessary for operating the SoC system 1000. In some embodiments of present inventive concepts, the central processing unit 1010 may be configured in a multi-core environment including a plurality of cores.

The multimedia system 1020 may be used in performing a variety of multimedia functions in the SoC system 1000. The multimedia system 1020 may include a 3D engine module, a video codec, a display system, a camera system, and a post-processor.

The bus 1030 may be used in performing data communication among the central processing unit 1010, the multimedia system 1020, the memory system 1040, and the peripheral circuit 1050. In some embodiments of present inventive concepts, the bus 1030 may have a multi-layered structure. In detail, examples of the bus 1030 may include a multi-layer advanced high-performance bus (AHB), or a multi-layer Advanced eXtensible Interface (AXI), but aspects of present inventive concepts are not limited thereto.

The memory system 1040 may provide environments necessary for high-speed operation by connecting the AP 1001 to an external memory (for example, the DRAM 1060). In some embodiments of present inventive concepts, the memory system 1040 may include a separate controller (for example, a DRAM controller) for controlling the external memory (for example, the DRAM 1060).

The peripheral circuit 1050 may provide environments necessary for smoothly connecting the SoC system 1000 to an external device (for example, a main board). Accordingly, the peripheral circuit 1050 may include various kinds of interfaces enabling the external device connected to the SoC system 1000 to be compatibly used.

The DRAM 1060 may function as a working memory required to operate the AP 1001. In some embodiments of present inventive concepts, as shown, the DRAM 1060 may be disposed outside the AP 1001. In detail, the DRAM 1060 may be packaged with the AP 1001 in the form of a package on package (PoP).

At least one of components of the SoC system 1000 may include the semiconductor devices according to some embodiments of present inventive concepts.

Figure 50:
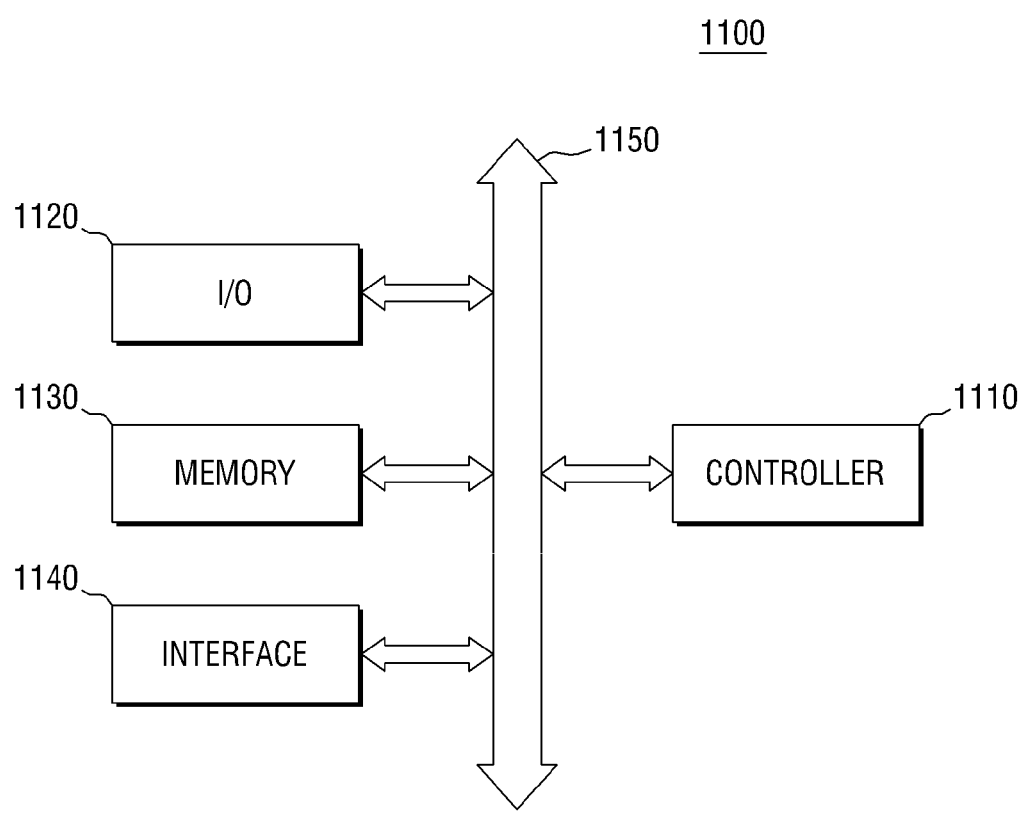
FIG. 50 is a block diagram of an electronic system including semiconductor devices according to some embodiments of present inventive concepts.

FIG. 50 is a block diagram of an electronic system including semiconductor devices according to some embodiments of present inventive concepts.

Referring to FIG. 50, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/0 1120 may include a key pad, a key board, a display device, and the like. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and the like.

The electronic system 1100 may further include high-speed DRAM and/or SRAM as the working memory for improving the operation of the controller 1110. Here, the semiconductor device shown in FIGS. 45 and 46 may be employed as the working memory. In addition, the semiconductor devices according to some embodiments of present inventive concepts may be provided in the memory device 1130 or may be provided some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 51:
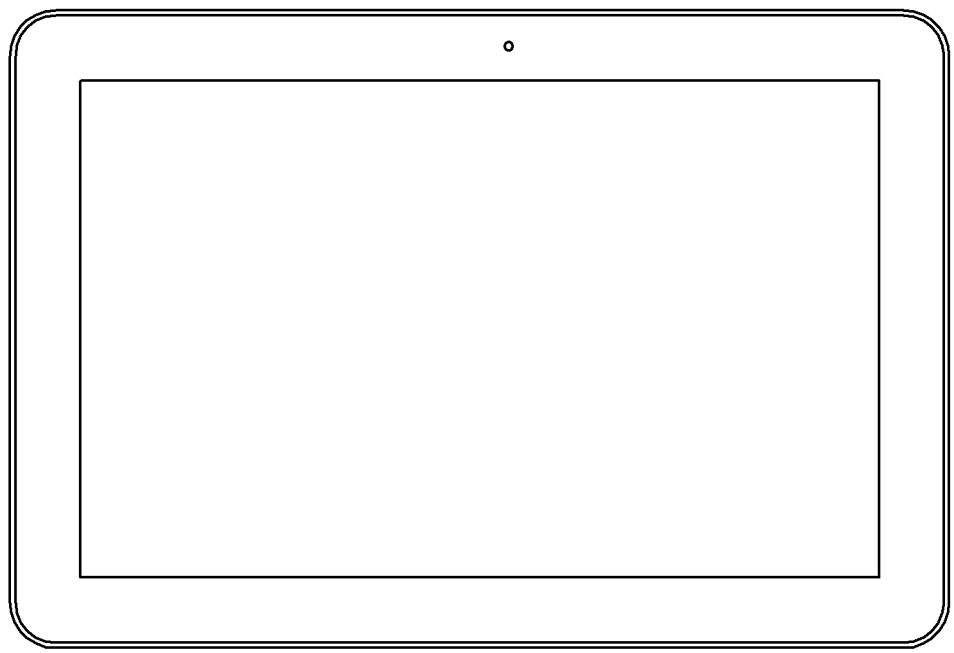
FIGS. 51 to 53 illustrate an example semiconductor system to which semiconductor devices according to some embodiments of present inventive concepts can be employed.
Figure 52:
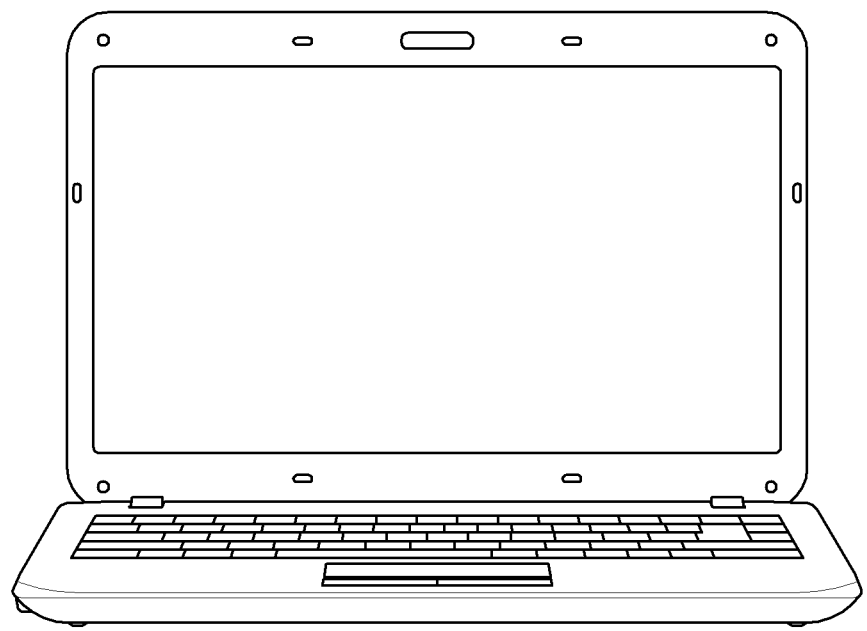
Figure 53:
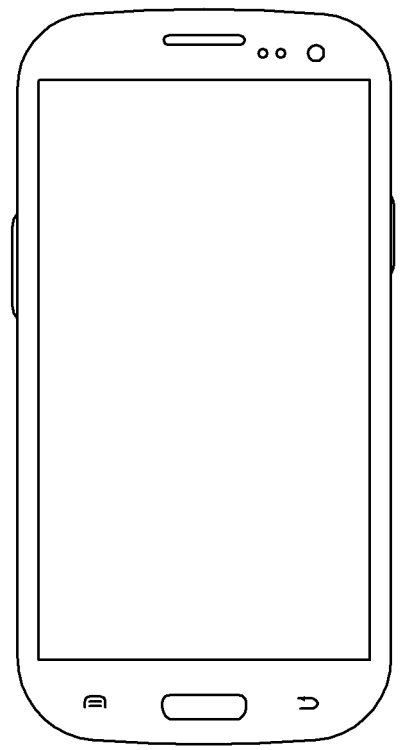

FIGS. 51 to 53 illustrate an example semiconductor system to which semiconductor devices according to some embodiments of present inventive concepts can be employed.

FIG. 51 illustrates an example in which a semiconductor device according to some embodiments of present inventive concepts is applied to a tablet computer (e.g., a tablet Personal Computer (PC)) 1200, FIG. 52 illustrates an example in which a semiconductor device according to some embodiments of present inventive concepts is applied to a notebook/laptop computer 1300, and FIG. 53 illustrates an example in which a semiconductor device according to some embodiments of present inventive concepts is applied to a smart phone 1400. At least one of the semiconductor devices according to some embodiments of present inventive concepts can be employed to a tablet computer, a notebook/laptop computer, a smart phone, and the like.

In addition, one skilled in the art would understand that the semiconductor devices according to some embodiments of present inventive concepts may also be applied to other Integrated Circuit (IC) devices not illustrated herein.

In the above-described embodiments, only the tablet computer 1200, the notebook/laptop computer 1300 and the smart phone 1400 have been provided as examples of the semiconductor devices according to some embodiments of present inventive concepts, aspects of present inventive concepts are not limited thereto.

In some embodiments of present inventive concepts, the semiconductor device may be implemented as a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a portable game console, a navigation device, a digital camera, a three-dimensional (3D) television, a digital audio recorder, a digital audio player, a digital picture recorder, a digital picture player, a digital video recorder, a digital video player, or the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   a base comprising a first semiconductor material;
   a first active fin upwardly protruding from the base and comprising a second semiconductor material different from the first semiconductor material;
   a second active fin upwardly protruding from the base, the second active fin comprising the second semiconductor material and being spaced apart from the first active fin;
   a gate insulation layer on a first lateral surface, a first top surface, and a second lateral surface of the first active fin, and on a third lateral surface, a second top surface, and a fourth lateral surface of the second active fin; and
   a gate electrode on the gate insulation layer,
   wherein the first active fin comprises first and second active layers that are sequentially stacked,
   wherein the first active layer comprises the second semiconductor material, and wherein the second active layer comprises a third semiconductor material different from the second semiconductor material; and
   a fin upwardly protruding from the base between the first and second active fins and comprising the first semiconductor material.

2. The semiconductor device of claim 1,
   wherein the first semiconductor material comprises a Group IV semiconductor, and
   wherein the second semiconductor material comprises a Group III-V compound semiconductor.

3. The semiconductor device of claim 2, wherein the first semiconductor material comprises Germanium (Ge) and the second semiconductor material comprises at least one of Indium Phosphide (InP) and Indium Gallium Arsenide (InGaAs).

4. The semiconductor device of claim 1, further comprising an isolation layer between the first and second active fins, wherein bottom portions of the first and second active fins extend along a top surface of the base.

5. The semiconductor device of claim further comprising:
   an isolation layer on the fin,
   wherein the first and second active fins are spaced apart from the fin by the isolation layer.

6. The semiconductor device of claim 1,
   wherein the first semiconductor material comprises Germanium (Ge),
   wherein the second semiconductor material comprises Indium Phosphide (InP), and
   wherein the third semiconductor material comprises Indium Gallium Arsenide (InGaAs).

7. The semiconductor device of claim 1,
   wherein the first active fin further comprises a third active layer on the second active layer, and
   wherein the third active layer comprises the second semiconductor material.

8. A semiconductor device comprising:
   a base comprising a first semiconductor material;
   a first active fin upwardly protruding from the base and comprising a second semiconductor material different from the first semiconductor material;
   a second active fin upwardly protruding from the base, the second active fin comprising the second semiconductor material and being spaced apart from the first active fin;
   a gate insulation layer on a first lateral surface, a first top surface, and a second lateral surface of the first active fin, and on a third lateral surface, a second top surface, and a fourth lateral surface of the second active fin;
   a gate electrode on the gate insulation layer; and
   a fin comprising the first semiconductor material, wherein the base comprises a first region and a second region, wherein the first and second active fins are in the first region, wherein the fin is in the second region, and wherein the gate insulation layer and the gate electrode are on the fin and the first and second active fins.

9. The semiconductor device of claim 8, wherein the first region comprises an NMOS region and the second region comprises a PMOS region.

10. A semiconductor device comprising: a base comprising a first semiconductor material;
    a first fin comprising the first semiconductor material and upwardly protruding from the base;
    a second fin upwardly protruding from the base, wherein the second fin is spaced apart from the first fin and comprises the first semiconductor material;
    a first active fin upwardly protruding from the base on the first fin and comprising a second semiconductor material different from the first semiconductor material;
    a second active fin upwardly protruding from the base on the second fin and comprising the, second semiconductor material;
    a gate insulation layer on the first and second active fins; and a gate electrode on the gate insulation layer and extending in a first direction, wherein the first active fin comprises first and second active layers that are sequentially stacked,
    wherein the first active layer comprises the second semiconductor material that is different from the first semiconductor material, and
    wherein the second active layer comprises a third semiconductor material that is different from the first and second semiconductor materials; and a fin upwardly protruding from the base between the first and second active fins and comprising the first semiconductor material.

11. The semiconductor device of claim 10, wherein the gate insulation layer is spaced apart from the first and second fins.

12. The semiconductor device of claim 10, wherein the first active fin further comprises a third active layer stacked on the second active layer and comprising the second semiconductor material.

13. The semiconductor device of claim 10,
wherein the first semiconductor material comprises a Group IV semiconductor, and
wherein the second and third semiconductor materials each comprise Group III-V compound semiconductors.

14. The semiconductor device of claim 13,
wherein the first semiconductor material comprises Germanium (Ge),
wherein the second semiconductor material comprises Indium Phosphide (InP), and
wherein the third semiconductor material comprises Indium Gallium Arsenide (InGaAs).

* * * * *